US010269958B2

(12) United States Patent
Kwon et al.

(10) Patent No.: US 10,269,958 B2
(45) Date of Patent: Apr. 23, 2019

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Jae Hong Kwon, Seoul (KR); Youngho Lee, Hwaseong-si (KR); Hoon Lim, Seoul (KR); Hyungsoon Jang, Hwaseong-si (KR); Eunguk Chung, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/928,516

(22) Filed: Mar. 22, 2018

(65) Prior Publication Data

US 2018/0219094 A1    Aug. 2, 2018

Related U.S. Application Data

(63) Continuation of application No. 15/385,060, filed on Dec. 20, 2016, now Pat. No. 9,978,865.

(30) Foreign Application Priority Data

Dec. 31, 2015    (KR) .................. 10-2015-0190834

(51) Int. Cl.
*H01L 29/78* (2006.01)
*H01L 27/092* (2006.01)
(Continued)

(52) U.S. Cl.
CPC .. *H01L 29/7833* (2013.01); *H01L 21/823807* (2013.01); *H01L 21/823814* (2013.01); *H01L 21/823821* (2013.01); *H01L 27/092* (2013.01); *H01L 27/0924* (2013.01); *H01L 27/1104* (2013.01); *H01L 28/00* (2013.01); (Continued)

(58) Field of Classification Search
None
See application file for complete search history.

(56) References Cited

U.S. PATENT DOCUMENTS 6,282,123 B1    8/2001    Mehta
7,385,259 B2    6/2008    Mouli
(Continued)

OTHER PUBLICATIONS

Kawa, et al. "FinFET Design, Manufacturability, and Reliability" R&D Group Director, Synopsys, Inc., DesignWare Technical Bulletin, pp. 1-4, (2016).
(Continued)

*Primary Examiner* — Benjamin P Sandvik
(74) *Attorney, Agent, or Firm* — Harness, Dickey & Pierce, P.L.C.

(57) ABSTRACT

A semiconductor device includes first source/drain regions disposed at both sides of a first gate structure and including dopants of a first conductivity type, counter regions being in contact with upper portions of the first source/drain regions and under both end portions of the first gate structure, and first halo regions in contact with bottom surfaces of the first source/drain regions. The counter regions include dopants of a second conductivity type that is different from the first conductivity type. The first halo regions include dopants of the second conductivity type.

20 Claims, 21 Drawing Sheets

(51) Int. Cl.
*H01L 27/11* (2006.01)
*H01L 29/08* (2006.01)
*H01L 29/16* (2006.01)
*H01L 29/66* (2006.01)
*H01L 21/8238* (2006.01)
*H01L 49/02* (2006.01)
*H01L 29/10* (2006.01)
*H01L 29/165* (2006.01)

(52) U.S. Cl.
CPC ...... *H01L 29/0852* (2013.01); *H01L 29/1608* (2013.01); *H01L 29/66545* (2013.01); *H01L 29/66628* (2013.01); *H01L 29/66636* (2013.01); *H01L 29/66681* (2013.01); *H01L 29/7834* (2013.01); *H01L 29/1045* (2013.01); *H01L 29/1083* (2013.01); *H01L 29/165* (2013.01); *H01L 29/7848* (2013.01)

(56) References Cited

U.S. PATENT DOCUMENTS

| | | | |
|---|---|---|---|
| 7,737,501 B2 | 6/2010 | Zhu et al. | |
| 8,164,145 B2 | 4/2012 | Wirbeleit | |
| 8,580,643 B2 | 11/2013 | Baldauf et al. | |
| 8,703,593 B2 | 4/2014 | Tsai et al. | |
| 8,709,902 B2 | 4/2014 | Scheiper et al. | |
| 8,709,928 B2 | 4/2014 | Yu et al. | |
| 8,722,498 B2 | 5/2014 | Scheiper et al. | |
| 8,735,266 B2 | 5/2014 | Wu et al. | |
| 8,779,527 B2 | 7/2014 | Merelle et al. | |
| 8,835,270 B2 | 9/2014 | Nandakumar | |
| 8,853,008 B1 | 10/2014 | Lee | |
| 9,214,358 B1 | 12/2015 | Lin et al. | |
| 9,502,563 B2 | 11/2016 | Shin et al. | |
| 9,704,864 B2 | 7/2017 | Park et al. | |
| 9,978,865 B2 * | 5/2018 | Kwon | H01L 27/092 |
| 2010/0109045 A1 | 5/2010 | Liu et al. | |
| 2011/0303990 A1 | 12/2011 | Dornel et al. | |
| 2013/0099326 A1 | 4/2013 | Wong et al. | |
| 2013/0235652 A1 | 9/2013 | Liaw | |
| 2013/0320434 A1 | 12/2013 | Shin et al. | |
| 2015/0108571 A1 | 4/2015 | Maciejewski et al. | |
| 2016/0284697 A1 | 9/2016 | Yoon et al. | |

OTHER PUBLICATIONS

Yamauchi "A Low Vth SRAM Reducing Mismatch of Cell-Stability with an Elevated Cell Biasing Scheme," Journal of Semiconductor Technology and Science, vol. 10, No. 2, pp. 118-129 (2010).

* cited by examiner

SEMICONDUCTOR DEVICE AND METHOD OF FABRICATING THE SAME

CROSS-REFERENCE TO RELATED APPLICATION

This application is a divisional of U.S. Non-Provisional patent application Ser. No. 15/385,060, filed on Dec. 20, 2016, which claims priority under 35 U.S.C. § 119 to Korean Patent Application No. 10-2015-0190834, filed on Dec. 31, 2015, in the Korean Intellectual Property Office, the entire contents of the above-referenced applications are incorporated herein by reference.

BACKGROUND

Example embodiments of inventive concepts relate to a semiconductor device and a method of fabricating the same and, more particularly, to a semiconductor device including a fin field effect transistor (Fin-FET) and a method of fabricating the same.

A semiconductor device may include an integrated circuit including metal-oxide-semiconductor field effect transistors (MOSFETs). As sizes and design rules of semiconductor devices have been reduced, MOSFETs have been scaled down. As sizes and design rules of semiconductor devices are reduced, various issues (e.g., a short channel effect) may deteriorate operating characteristics of semiconductor devices.

SUMMARY

Example embodiments of inventive concepts may provide a semiconductor device capable of improving reliability.

Example embodiments of inventive concepts may also provide a method of fabricating a semiconductor device with improved reliability.

According to example embodiments of inventive concepts, a semiconductor device may include a substrate including a first region and a second region, the substrate including a first active pattern protruding from the first region; a first device isolation pattern on the substrate, the first device isolation pattern defining the first active pattern; a first gate structure on the substrate, the first gate structure intersecting the first active pattern and the first device isolation pattern; first source/drain regions at both sides of the first gate structure, the first source/drain regions including dopants of a first conductivity type and defining a first channel region in the first active pattern under the first gate structure; counter regions in the first active pattern between the first channel region and the first source/drain regions under both end portions of the first gate structure, the counter regions including dopants of a second conductivity type different from the first conductivity type; and first halo regions in the first active pattern under the first source/drain regions, the first halo regions including dopants of the second conductivity type.

According to example embodiments of inventive concepts, a semiconductor device may include a substrate including a memory region and a logic region, first transistors on the memory region, and second transistors on the logic region. Each of the first transistors may include a first gate structure, first source/drain regions, and counter regions. The first source/drain regions may be at both sides of the first gate structure. The first source/drain regions may include dopants of a first conductivity type and may define a first channel region. The counter regions may be between the first channel region and the first source/drain regions under both end portions of the first gate structure. The counter regions may include dopants of a second conductivity type opposite to the first conductivity type. Each of the second transistors may include a second gate structure, second source/drain regions, and LDD regions. The second source/drain region may be at both sides of the second gate structure. The second source/drain regions may include dopants of a third conductivity type and may define a second channel region. The LDD regions may be between the second channel region and the second source/drain regions under both end portions of the second gate structure. The LDD regions may include dopants of the third conductivity type.

According to example embodiments of inventive concepts, a method of fabricating a semiconductor device may include forming a device isolation pattern on a substrate including an active pattern protruding from the substrate, the device isolation pattern exposing an upper portion of the active pattern; forming a preliminary gate structure on the substrate, the preliminary gate structure intersecting the active pattern and the device isolation pattern; forming halo regions having a first depth in the active pattern, the forming the halo regions including implanting first dopant ions of a first conductivity type into the active pattern at both sides of the preliminary gate structure; forming counter regions having a second depth smaller than the first depth in the active pattern, the forming the counter regions including implanting second dopant ions of the first conductivity type into the active pattern at both sides of the preliminary gate structure; etching the active pattern at both sides of the preliminary gate structure to form recess regions; and forming source/drain regions in the recess regions using an epitaxial growth process, the source/drain regions including dopants of a second conductivity type opposite to the first conductivity type.

According to example embodiments of inventive concepts, a method of fabricating a semiconductor device may include forming a device isolation pattern on a substrate, the device isolation pattern defining a first active pattern of a first region of the substrate and a second active pattern of a second region of the substrate; forming a first preliminary gate structure on the first region, the first preliminary gate structure intersecting the first active pattern and the device isolation pattern; forming a second preliminary gate structure on the second region, the second preliminary gate structure intersecting the second active pattern and the device isolation pattern; forming counter regions by implanting dopant ions of a first conductivity type into the first active pattern at both sides of the first preliminary gate structure; forming LDD regions by implanting dopant ions of a second conductivity type opposite to the first conductivity type into the second active pattern at both sides of the second preliminary gate structure; etching the first active pattern at both sides of the first preliminary gate structure and the second active pattern at both sides of the second preliminary gate structure to form first recess regions in the first active pattern and second recess regions in the second active pattern; and forming first source/drain regions in the first recess regions and second source/drain regions in the second recess regions, the first and second source/drain regions including dopants of the second conductivity type.

According to example embodiments of inventive concepts, a method of fabricating a semiconductor device may include forming a device isolation pattern on a substrate, the device isolation pattern defining a first active pattern of a first region of the substrate and a second active pattern of a second region of the substrate; forming a first preliminary N-type gate structure and a first preliminary P-type gate structure intersecting the first active pattern and the device isolation pattern on the first region; forming a second preliminary N-type gate structure and a second preliminary P-type gate structure intersecting the second active patterns and the device isolation pattern on the second region; injecting P-type dopants into the first active pattern and the second active pattern to form first counter regions in the first active pattern at both sides of the first preliminary N-type gate structure and to form first LDD regions in the second active pattern at both sides of the second preliminary P-type gate structure, and etching the first active pattern at both sides of the first preliminary N-type gate structure, the first active pattern at both sides of the first preliminary P-type gate structure, the second active pattern at both sides of the second preliminary N-type gate structure, and the second active pattern at both sides of the second preliminary P-type gate structure to form first recess regions in the first region and second recess regions in the second region.

According to example embodiments of inventive concepts, a semiconductor device includes a substrate including first active patterns and second active patterns protruding from the substrate, gate structures on the substrate crossing over the first and second active patterns, and a device isolation pattern on the substrate. The first active patterns each include a first channel region between first source/drain regions, first halo regions below the first source/drain regions, and first impurity regions between an upper part of the first channel regions and an upper part for the first source/drain regions. The first source/drain regions include dopants of a first conductivity type. The first halo regions and the first impurity regions include dopants of a second conductivity type that is opposite the first conductivity type. The gate structures extend in a first direction and are spaced apart from each other in a second direction. The first active patterns protrude through the device isolation pattern.

BRIEF DESCRIPTION OF THE DRAWINGS

Inventive concepts will become more apparent in view of the attached drawings and accompanying detailed description.

FIGS. 4A to 12A are cross-sectional views taken along lines I-I', II-II', and III-III' of FIG. 1 to illustrate a method of fabricating a semiconductor device according to example embodiments of inventive concepts.

FIGS. 4B to 12B are cross-sectional views taken along lines IV-IV' and V-V' of FIG. 1 to illustrate a method of fabricating a semiconductor device according to example embodiments of inventive concepts.

DETAILED DESCRIPTION OF THE EMBODIMENTS

Figure 1:
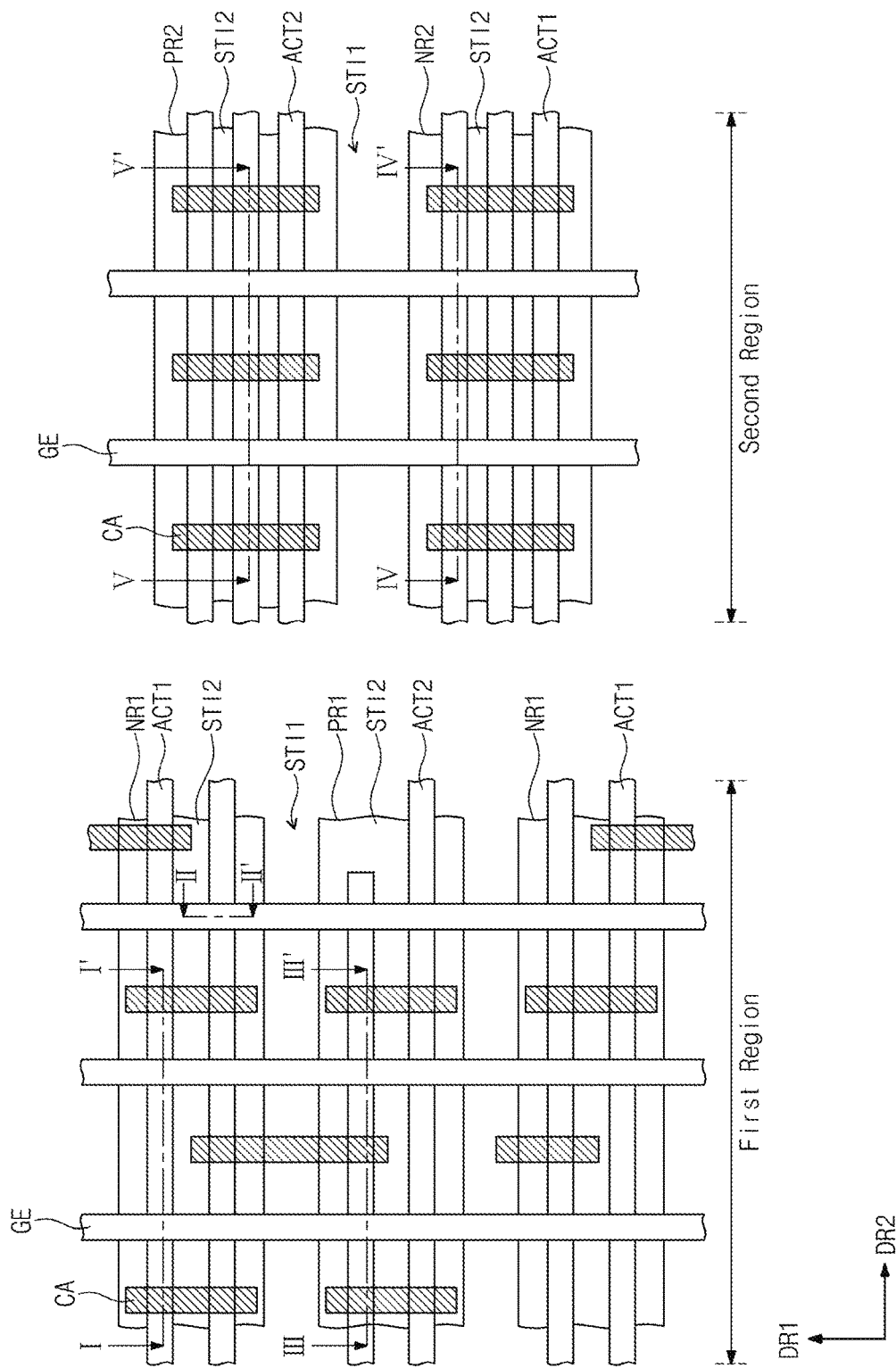
FIG. 1 is a plan view illustrating a semiconductor device according to example embodiments of inventive concepts.
Figure 2:
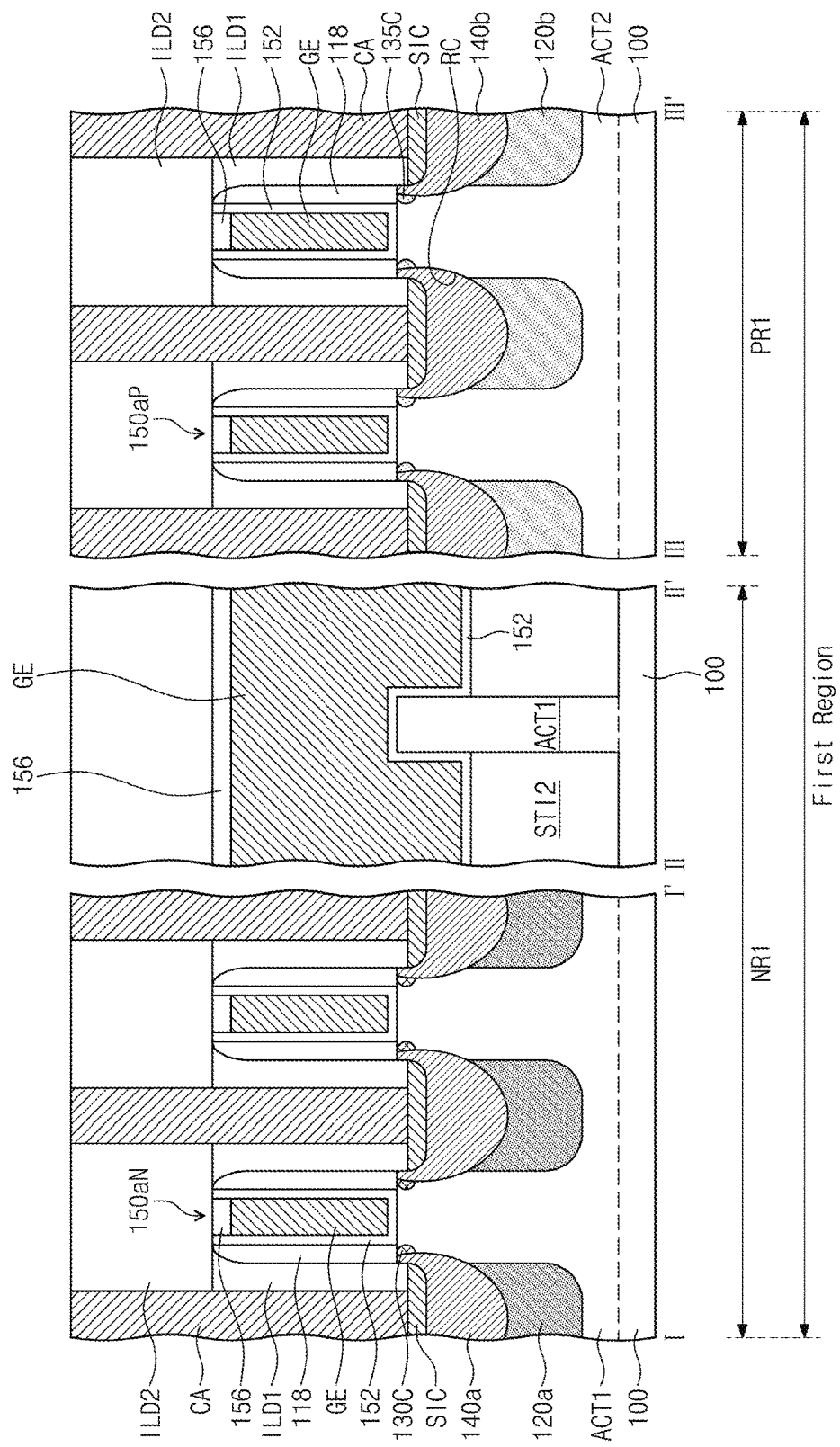
FIG. 2 is a cross-sectional view taken along lines I-I', II-II', and III-III' of FIG. 1.

FIG. 1 is a plan view illustrating a semiconductor device according to example embodiments of inventive concepts. FIG. 2 is a cross-sectional view taken along lines I-I', II-II', and III-III' of FIG. 1, and FIG. 3 is a cross-sectional view taken along lines IV-IV' and V-V' of FIG. 1.

Figure 3:
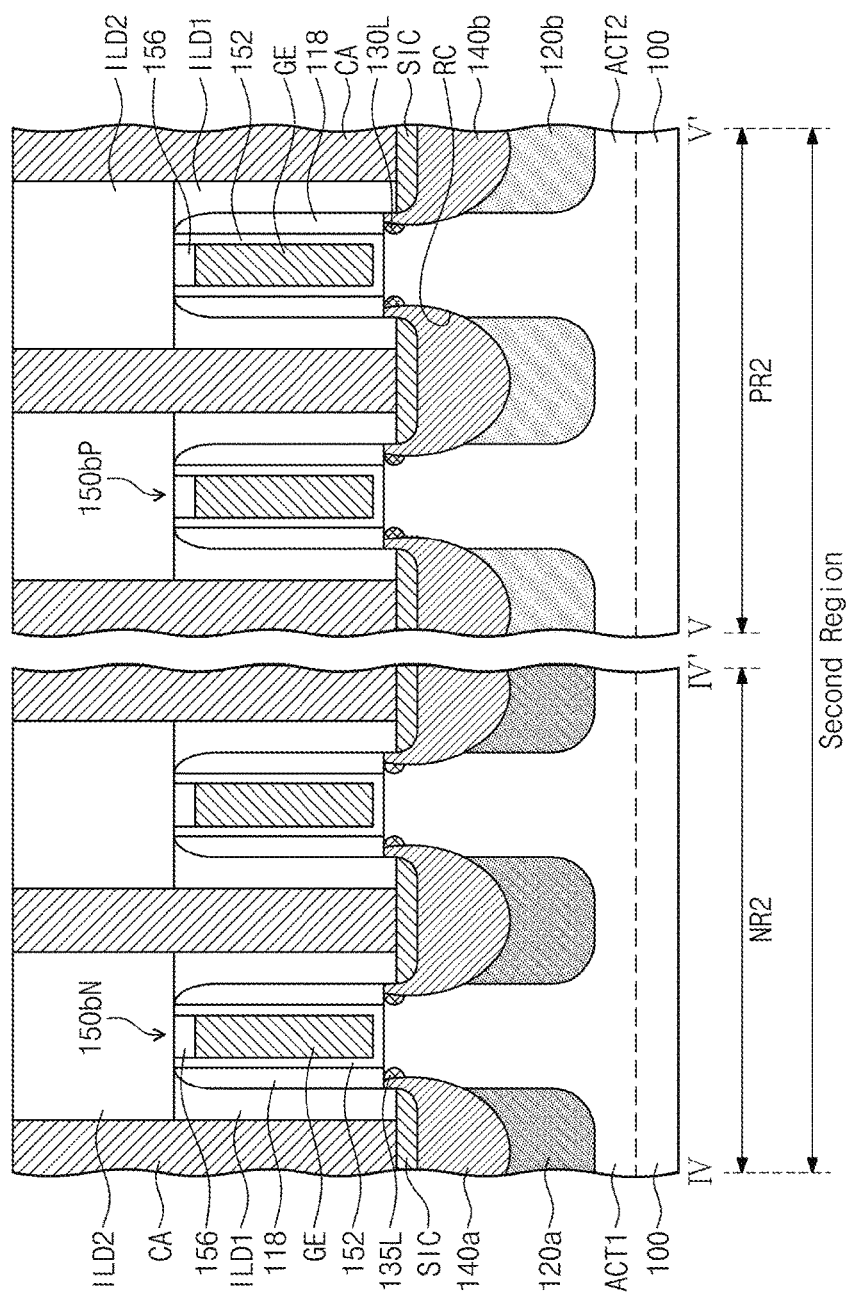
FIG. 3 is a cross-sectional view taken along lines IV-IV' and V-V' of FIG. 1.

Referring to FIGS. 1, 2, and 3, a semiconductor device may include a substrate 100, a memory cell transistor, and a logic transistor.

The substrate 100 may be a semiconductor substrate or a semiconductor-on-insulator substrate. The semiconductor substrate may include silicon (Si), germanium (Ge), or silicon-germanium (SiGe). The semiconductor-on-insulator substrate may be a silicon-on-insulator (SOI) substrate, a germanium-on-insulator (GOI) substrate. The substrate may include an epitaxial silicon layer obtained by performing a selective epitaxial growth (SEG) process.

The substrate 100 may include a first region and a second region. The first region may correspond to a portion of a memory cell region on which a plurality of memory cells for storing data are formed. In example embodiments, memory cell transistors constituting a plurality of 6T static random access memory (SRAM) cells may be disposed on the first region. Each of the 6T SRAM cells may have six transistors. The second region may correspond to a portion of a logic cell region on which logic cells constituting a logic circuit are disposed. The logic cells may include logic transistors. In example embodiments, the second region may be a region on which logic transistors constituting a processor core or an input/output (I/O) terminal are formed. However, example embodiments of inventive concepts are not limited thereto.

Hereinafter, the first region will be described first.

The first region may include a first NMOSFET region NR1 and a first PMOSFET region PR1. At least one N-type transistor (e.g., an N-channel MOS field effect transistor) may be disposed on the first NMOSFET region NR1, and at least one P-type transistor (e.g., a P-channel MOS field effect transistor) may be disposed on the first PMOSFET region PR1. The first NMOSFET region NR1 may be provided in plurality in the first region, and the first PMOSFET region PR1 may be provided in plurality in the first region. In example embodiments, the first NMOSFET regions NR1 and the first PMOSFET regions PR1 may be alternately arranged in a first direction DR1.

Active patterns ACT1 and ACT2 may be provided on the first region. In example embodiments, first active patterns ACT1 protruding from the substrate 100 may be disposed on the first NMOSFET region NR1 of the first region. The first active patterns ACT1 may be arranged along the first direction DR1 and may have linear shapes extending in a second direction DR2 intersecting the first direction DR1. Second active patterns ACT2 protruding from the substrate 100 may be disposed on the first PMOSFET region PR1 of the first region. The second active patterns ACT2 may be arranged along the first direction DR1 and may have linear shapes extending in the second direction DR2.

Device isolation patterns STI1 and STI2 may be provided to insulate the first and second active patterns ACT1 and ACT2 from each other. The device isolation patterns STI1 and STI2 may include first device isolation patterns ST1 disposed at both sides of each of the first NMOSFET and PMOSFET regions NR1 and PR1, and second device isolation patterns STI2 disposed between the first active patterns ACT1 and between the second active patterns ACT2. The first device isolation patterns STI1 and the second device isolation pattern STI2 may be connected to each other to constitute an insulating layer of one body. The first and second device isolation patterns STI1 and STI2 may include at least one of silicon oxide, silicon nitride, or silicon oxynitride.

In example embodiments, top surfaces of the second device isolation patterns STI2 may be lower than top surfaces of the active patterns ACT1 and ACT2. In other words, portions of sidewalls and the top surfaces of the first and second active patterns ACT1 and ACT2 may be exposed by the second device isolation patterns STI2.

Gate electrodes GE may be provided on the first and second active patterns ACT1 and ACT2. The gate electrodes GE may extend in the first direction DR1 to intersect the first and second active patterns ACT1 and ACT2 and the first and second device isolation patterns STI1 and STI2. The gate electrodes GE may cover the top surfaces and the sidewalls of the first and second active patterns ACT1 and ACT2. The gate electrodes GE may be spaced apart from each other in the second direction DR2.

A gate insulating layer 152 may be disposed between each of the gate electrodes GE and the first and second active patterns ACT1 and ACT2. The gate insulating layer 152 may also be disposed between each of the gate electrodes GE and gate spacers 118. The gate spacers 118 may be provided on both sidewalls of each of the gate electrodes GE. A capping pattern 156 may be provided on a top surface of each of the gate electrodes GE.

The gate electrodes GE may include at least one of a doped semiconductor material, a conductive metal nitride (e.g., titanium nitride or tantalum nitride), or a metal (e.g., aluminum or tungsten). The gate insulating layer 152 may include at least one of a silicon oxide layer, a silicon oxynitride layer, or a high-k dielectric layer of which a dielectric constant is higher than that of a silicon oxide layer. For example, the high-k dielectric layer may include a hafnium oxide layer, a hafnium silicate layer, a zirconium oxide layer, and/or a zirconium silicate layer. Each of the capping pattern 156 and the gate spacer 118 may include at least one of silicon oxide, silicon nitride, or silicon oxynitride.

Source/drain regions 140a and 140b may be disposed at both sides of each of the gate electrodes GE. The source/drain regions 140a and 140b may fill recess regions RC formed in the first and second active patterns ACT1 and ACT2 at both sides of each of the gate electrodes GE. In example embodiments, first source/drain regions 140a may be disposed in the recess regions RC of the first active pattern ACT1, and second source/drain regions 140b may be disposed in the recess regions RC of the second active pattern ACT2. In example embodiments, the first source/drain regions 140a of the first NMOSFET region NR1 may have an N-type conductivity, and the second source/drain regions 140b of the first PMOSFET region PR1 may have a P-type conductivity. In example embodiments, a dopant dose used to form the first source/drain regions 140a may range from about $5.0 \times 10^{13}/\text{cm}^2$ to about $1.0 \times 10^{15}/\text{cm}^2$. In example embodiments, a dopant dose used to form the second source/drain regions 140b may range from about $1.0 \times 10^{14}/\text{cm}^2$ to about $1.0 \times 10^{16}/\text{cm}^2$.

Each of the first and second active patterns ACT1 and ACT2 may include a channel region disposed between the first or second source/drain regions 140a or 140b. For example, the first active pattern ACT1 may include a first channel region disposed between the first source/drain regions 140a. The second active pattern ACT2 may include a second channel region disposed between the second source/drain regions 140b. The first channel regions and the second channel regions may be disposed under the gate electrodes GE and may vertically overlap with the gate electrodes GE.

The first source/drain regions 140a may include a material capable of applying a tensile strain to the first channel regions, and the second source/drain regions 140b may include a material capable of applying a compressive strain to the second channel regions. In example embodiments, when the substrate 100 is a silicon substrate, the first source/drain regions 140a may include a silicon carbide (SiC) layer of which a lattice constant is smaller than that of the substrate 100, or a silicon layer of which a lattice constant is substantially equal to that of the substrate 100. In addition, the second source/drain regions 140b may include a silicon-germanium (SiGe) layer of which a lattice constant is greater than that of silicon.

Halo regions 120a and 120b may be formed in the first and second active patterns ACT1 and ACT2 under the first and second source/drain regions 140a and 140b, respectively. A conductivity type of first halo regions 120a under the first source/drain regions 140a may be opposite to that of the first source/drain regions 140a, and a conductivity type of second halo regions 120b under the second source/drain regions 140b may be opposite to that of the second source/drain regions 140b. In example embodiments, the first halo regions 120a under the first source/drain regions 140a may have a P-type conductivity, and a dopant dose used to form the first halo regions 120a may range from about $1.0 \times 10^{12}/\text{cm}^2$ to about $3.0 \times 10^{14}/\text{cm}^2$. In example embodiments, the second halo regions 120b under the second source/drain regions 140b may have an N-type conductivity, and a dopant dose used to form the second halo regions 120b may range from about $1.0 \times 10^{12}/\text{cm}^2$ to about $3.5 \times 10^{14}/\text{cm}^2$.

According to example embodiments of inventive concepts, counter regions 130C and 135C may be formed in upper portions of the first and second active patterns ACT1 and ACT2 and may be in contact with the gate spacers 118. Each of the counter regions 130C and 135C may be provided between the channel region and each of the first and second source/drain regions 140a and 140b. A conductivity type of each of the counter regions 130C and 135C may be opposite to that of each of the source/drain regions 140a and 140b adjacent thereto. For example, first counter regions 130C adjacent to sidewalls of the first source/drain regions 140a may have a P-type conductivity. The first counter regions 130C may have the same conductivity type (e.g., the P-type conductivity) as the first halo regions 120a, and a dopant dose used to form the first counter regions 130C may be greater than the dopant dose used to form the first halo regions 120a. In example embodiments, the dopant dose used to form the first counter regions 130C may range from about $9.5 \times 10^{13}/\text{cm}^2$ to about $1.25 \times 10^{14}/\text{cm}^2$. Second counter regions 135C adjacent to sidewalls of the second source/drain regions 140b may have an N-type conductivity. The second counter regions 135C may have the same conductivity type (e.g., the N-type conductivity) as the second halo regions 120b, and a dopant dose used to form the second counter regions 135C may be greater than the dopant dose used to form the second halo regions 120b. In example embodiments, the dopant dose used to form the second counter regions 135C may range from about $5.0 \times 10^{13}/\text{cm}^2$ to about $1.25 \times 10^{14}/\text{cm}^2$. The first and second halo regions 120a and 120b may not be in contact with the first and second counter regions 130C and 135C but may be spaced apart from the first and second counter regions 130C and 135C. The first and second halo regions 120a and 120b may be spaced apart from the first and second counter regions 130C and 135C by the first and second source/drain regions 140a and 140b, respectively.

Source/drain contact plugs CA may be disposed at both sides of each of the gate electrodes GE. The source/drain contact plugs CA may penetrate a second interlayer insulating layer ILD2 and a first interlayer insulating layer ILD1 so as to be electrically connected to the first and second source/drain regions 140a and 140b. Each of the source/drain contact plugs CA may intersect at least one of the first active patterns ACT1 or at least one of the second active patterns ACT2 when viewed from a plan view. The source/drain contact plugs CA may include at least one of tungsten, titanium, or tantalum.

A metal silicide layer SIC may be disposed between each of the source/drain contact plugs CA and a corresponding one of the first and second source/drain regions 140a and 140b. For example, the metal silicide layer SIC may include at least one of titanium silicide, tantalum silicide, or tungsten silicide.

Next, the second region will be described. Hereinafter, the detailed descriptions to the same technical features as corresponding ones of the first region will be omitted or mentioned briefly for the purpose of ease and convenience in explanation.

Active patterns ACT1 and ACT2 may be provided on the second region. In example embodiments, first active patterns ACT1 protruding from the substrate 100 may be disposed on a second NMOSFET region NR2 of the second region, and second active patterns ACT2 protruding from the substrate 100 may be disposed on a second PMOSFET region PR2 of the second region.

Device isolation patterns STI1 and STI2 may be provided to insulate the active patterns ACT1 and ACT2 of the second region from each other. The device isolation patterns STI1 and STI2 may include first device isolation patterns ST1 disposed at both sides of each of the second NMOSFET and PMOSFET regions NR2 and PR2 of the second region, and second device isolation patterns STI2 disposed between the first active patterns ACT1 of the second region and between the second active patterns ACT2 of the second region. The first device isolation patterns STI1 and the second device isolation pattern STI2 of the second region may be connected to each other to constitute an insulating layer of one body. The device isolation patterns STI1 and STI2 may include at least one of silicon oxide, silicon nitride, or silicon oxynitride.

Gate electrodes GE may be provided on the first and second active patterns ACT1 and ACT2 of the second region. The gate electrodes GE may extend in the first direction DR1 to intersect the first and second active patterns ACT1 and ACT2 and the first and second device isolation patterns STI1 and STI2 of the second region. The gate electrodes GE of the second region may cover the top surfaces and the sidewalls of the first and second active patterns ACT1 and ACT2 of the second region. The gate electrodes GE of the second region may be spaced apart from each other in the second direction DR2.

A gate insulating layer 152 may be disposed between each of the gate electrodes GE and the first and second active patterns ACT1 and ACT2. The gate insulating layer 152 may also be disposed between each of the gate electrodes GE and gate spacers 118. The gate spacers 118 may be provided on both sidewalls of each of the gate electrodes GE. A capping pattern 156 may be provided on a top surface of each of the gate electrodes GE.

Source/drain regions 140a and 140b may be disposed at both sides of each of the gate electrodes GE of the second region. The source/drain regions 140a and 140b may fill recess regions RC formed in the first and second active patterns ACT1 and ACT2 of the second region at both sides of each of the gate electrodes GE of the second region. In example embodiments, first source/drain regions 140a may be disposed in the recess regions RC of the first active pattern ACT1 of the second NMOSFET region NR2, and second source/drain regions 140b may be disposed in the recess regions RC of the second active pattern ACT2 of the second PMOSFET region PR2. In example embodiments, the first source/drain regions 140a of the second NMOSFET region NR2 may have an N-type conductivity, and the second source/drain regions 140b of the second PMOSFET region PR2 may have a P-type conductivity.

Each of the first and second active patterns ACT1 and ACT2 may include a channel region disposed between the first or second source/drain regions 140a or 140b. For example, the first active pattern ACT1 may include a first channel region disposed between the first source/drain regions 140a. The second active pattern ACT2 may include a second channel region disposed between the second source/drain regions 140b. The first channel regions and the second channel regions may be disposed under the gate electrodes GE and may vertically overlap with the gate electrodes GE.

Halo regions 120a and 120b may be formed in the first and second active patterns ACT1 and ACT2 under the first and second source/drain regions 140a and 140b of the second region, respectively. A conductivity type of halo regions 120a under the first source/drain regions 140a may be opposite to that of the first source/drain regions 140a, and a conductivity type of halo regions 120b under the second source/drain regions 140b may be opposite to that of the second source/drain regions 140b. For example, the halo regions 120a under the first source/drain regions 140a may have a P-type conductivity, and the halo regions 120b under the second source/drain regions 140b may have an N-type conductivity. In addition, light doped drain (LDD) regions 130L and 135L may be formed in upper portions of the first and second active patterns ACT1 and ACT2 of the second region and may be in contact with the gate spacers 118 of the second region. The counter regions 130C and LDD regions 130L may be referred to as first impurity regions. The counter regions 135C and LDD regions 135L may be referred to as second impurity regions. Each of first LDD regions 130L may be provided between the channel region and each of the second source/drain regions 140b of the second region. Each of second LDD regions 135L may be provided between the channel region and each of the first source/drain regions 140a of the second region. The first and second LDD regions 130L and 135L may have the same conductivity type as the second and first source/drain regions 140b and 140a of the second region, respectively. A dopant dose used to form the LDD regions 130L and 135L may be smaller than a dopant dose used to form the source/drain regions 140a and 140b of the second region. For example, the second LDD regions 135L adjacent to the first source/drain regions 140a of the second region may have an N-type conductivity. A dopant dose used to form the second LDD regions 135L may be substantially equal to the dopant dose used to form the second counter regions 135C of the first region. In example embodiments, the dopant dose used to form the second LDD regions 135L may range from about $5.0 \times 10^{13}/\text{cm}^2$ to about $1.25 \times 10^{14}/\text{cm}^2$. The first LDD regions 130L adjacent to the second source/drain regions 140b of the second region may have a P-type conductivity. A dopant dose used to form the first LDD regions 130L may be substantially equal to the dopant dose used to form the first counter regions 130C of the first region. In example embodiments, the dopant dose used to form the first LDD regions 130L may range from about $9.5 \times 10^{13}/\text{cm}^2$ to about $1.25 \times 10^{14}/\text{cm}^2$.

Source/drain contact plugs CA may be disposed at both sides of each of the gate electrodes GE of the second region.

The source/drain contact plugs CA may penetrate the second interlayer insulating layer ILD2 and the first interlayer insulating layer ILD1 so as to be electrically connected to the source/drain regions 140a and 140b of the second region. A metal silicide layer SIC may be disposed between each of the source/drain contact plugs CA and a corresponding one of the source/drain regions 140a and 140b of the second region. According to example embodiments of inventive concepts, first gate structures 150aN and 150aP of the first region may be included in the memory cell transistors, and second gate structures 150bN and 150bP of the second region may be included in the logic transistors. The memory cell transistors and the logic transistors may be fin-type transistors. Since the fin-type transistor includes a three-dimensional channel, shapes of source/drain regions and a gate electrode of the fin-type transistor may be different from those of source/drain regions and a gate electrode of a planar transistor. In particular, sensitivity of halo regions may be reduced as a width of the gate electrode is reduced. If a dopant dose used to form the halo regions is increased, random dopant fluctuation of a channel region may occur to cause great variation of currents and voltages (e.g., threshold voltages) measured from the memory cell transistors and the logic transistors.

However, according to example embodiments of inventive concepts, the counter regions 130C and 135C may be provided along with the halo regions 120a and 120b in the first region, and the LDD regions 130L and 135L may be provided along with the halo regions 120a and 120b in the second region. Thus, the halo regions 120a and 120b may not influence bottom end portions of the channel regions of the memory cell transistors and the logic transistors. As a result, the currents and voltages measured from the transistors may be maintained at a deviation of about 10% or less, more particularly, about 8% or less.

A method of fabricating a semiconductor device will be described hereinafter.

FIGS. 4A to 12A are cross-sectional views taken along lines I-I', II-II', and III-III' of FIG. 1 to illustrate a method of fabricating a semiconductor device according to example embodiments of inventive concepts. FIGS. 4B to 12B are cross-sectional views taken along lines IV-IV' and V-V' of FIG. 1 to illustrate a method of fabricating a semiconductor device according to example embodiments of inventive concepts.

Figure 4A:
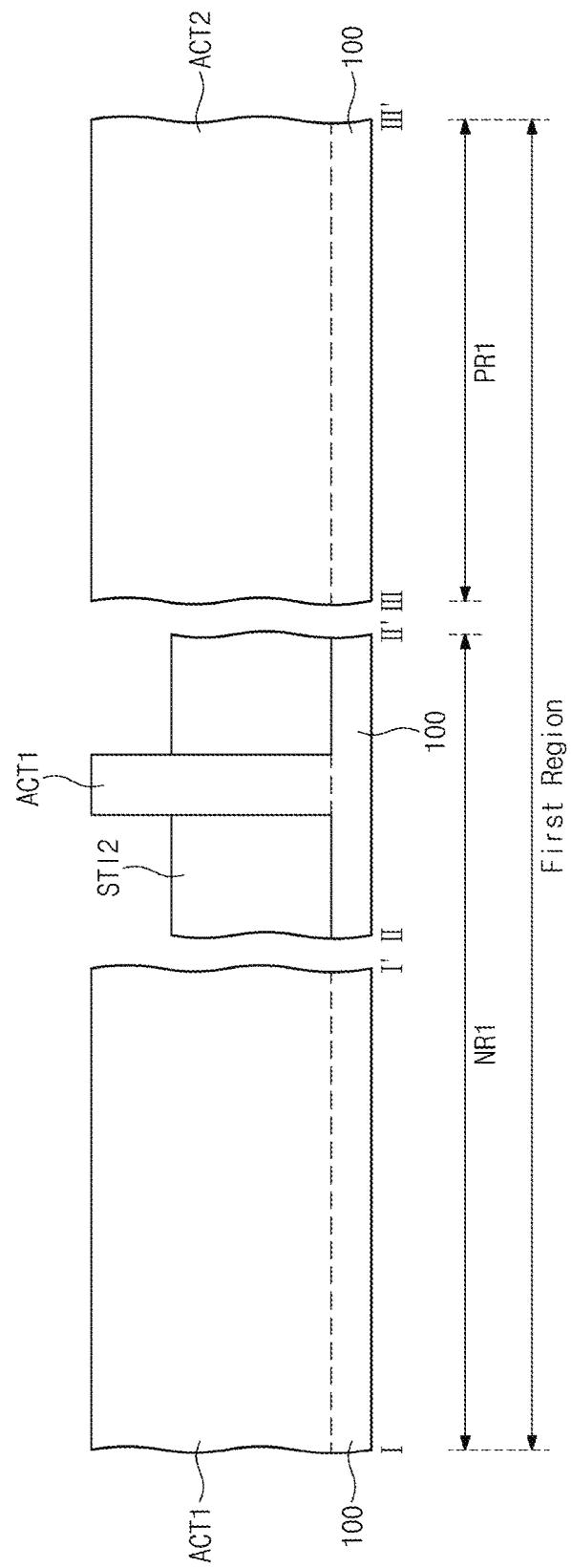
Figure 4B:
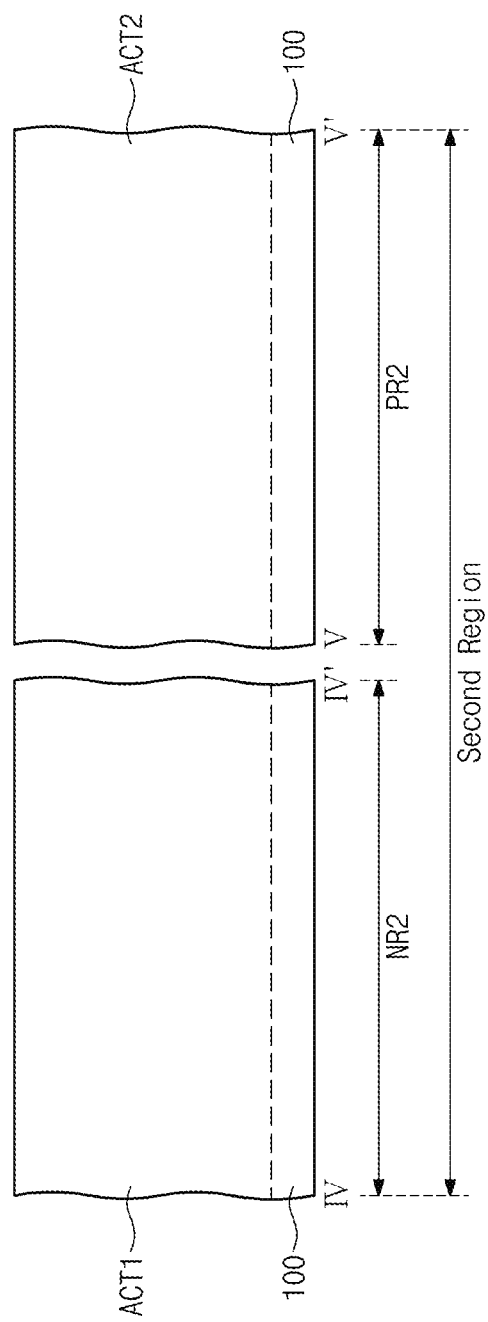

Referring to FIGS. 4A and 4B, active patterns ACT1 and ACT2 and device isolation patterns STI2 may be formed on a substrate 100. The device isolation patterns STI1 of FIG. 1 may be formed simultaneously with the device isolation patterns STI2 or may be formed before or after the formation of the device isolation patterns STI2.

The substrate 100 may include a first region on which a memory cells are provided, and a second region on which a logic circuit is provided. The first region may include a first NMOSFET region NR1 and a first PMOSFET region PR1, and the second region may include a second NMOSFET region NR2 and a second PMOSFET region PR2.

In example embodiments, forming the active patterns ACT1 and ACT2 may include forming a mask pattern (not shown) on the substrate 100, and etching the substrate 100 using the mask pattern as an etch mask to form trenches extending in the first direction DR1 of FIG. 1. Bottom surfaces of the trenches may be lower than a top surface of the substrate 100, and thus the active patterns ACT1 and ACT2 may protrude from the bottom surfaces of the trenches and may extend in the first direction DR1.

In some example, forming the active patterns ACT1 and ACT2 may include forming a mask pattern on the substrate 100, and performing a selective epitaxial growth (SEG) process on the substrate 100 exposed by the mask pattern. In this case, the active patterns ACT1 and ACT2 may protrude from the top surface of the substrate 100 and may extend in the first direction DR1. The mask pattern may be removed to define trenches at both sides of each of the active patterns ACT1 and ACT2.

The device isolation patterns STI2 may be formed at both sides of each of the active patterns ACT1 and ACT2. Each of the device isolation patterns STI2 may partially fill each of the trenches. Forming the device isolation patterns STI2 may include forming an insulating layer filling the trenches on the substrate 100, and recessing an upper portion of the insulating layer to expose upper portions of the active patterns ACT1 and ACT2. The insulating layer may include at least one of a silicon oxide layer, a silicon nitride layer, or a silicon oxynitride layer. Meanwhile, a remaining mask pattern may be removed during the process of recessing the insulating layer.

The active patterns ACT1 and ACT2 may include first active patterns ACT1 at which N-type transistors are formed, and second active patterns ACT2 at which P-type transistors are formed. In other words, the first active patterns ACT1 may be provided on the first NMOSFET region NR1 and the second NMOSFET region NR2, and the second active patterns ACT2 may be provided on the first PMOSFET region PR1 and the second PMOSFET region PR2.

Figure 5A:
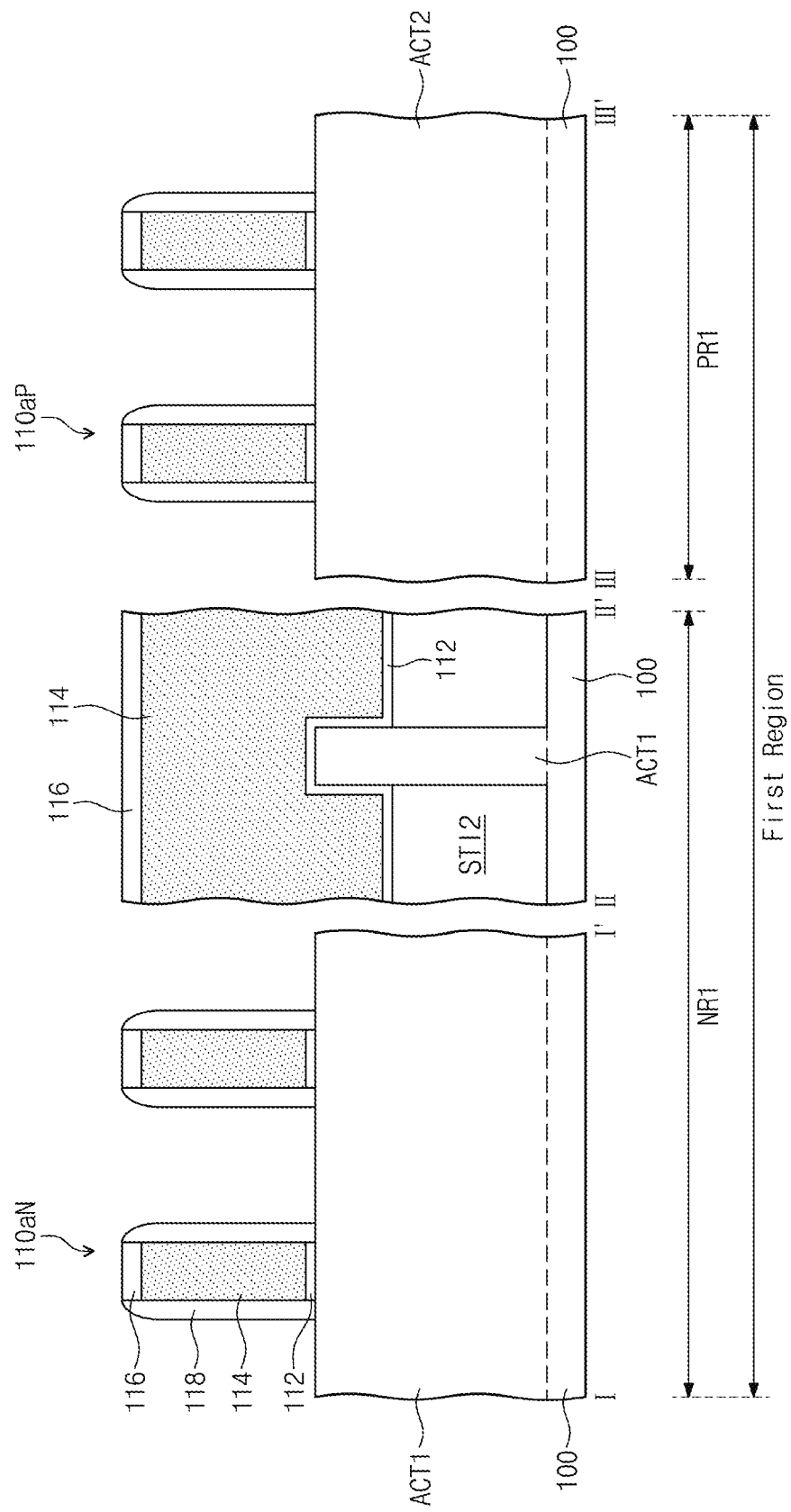
Figure 5B:
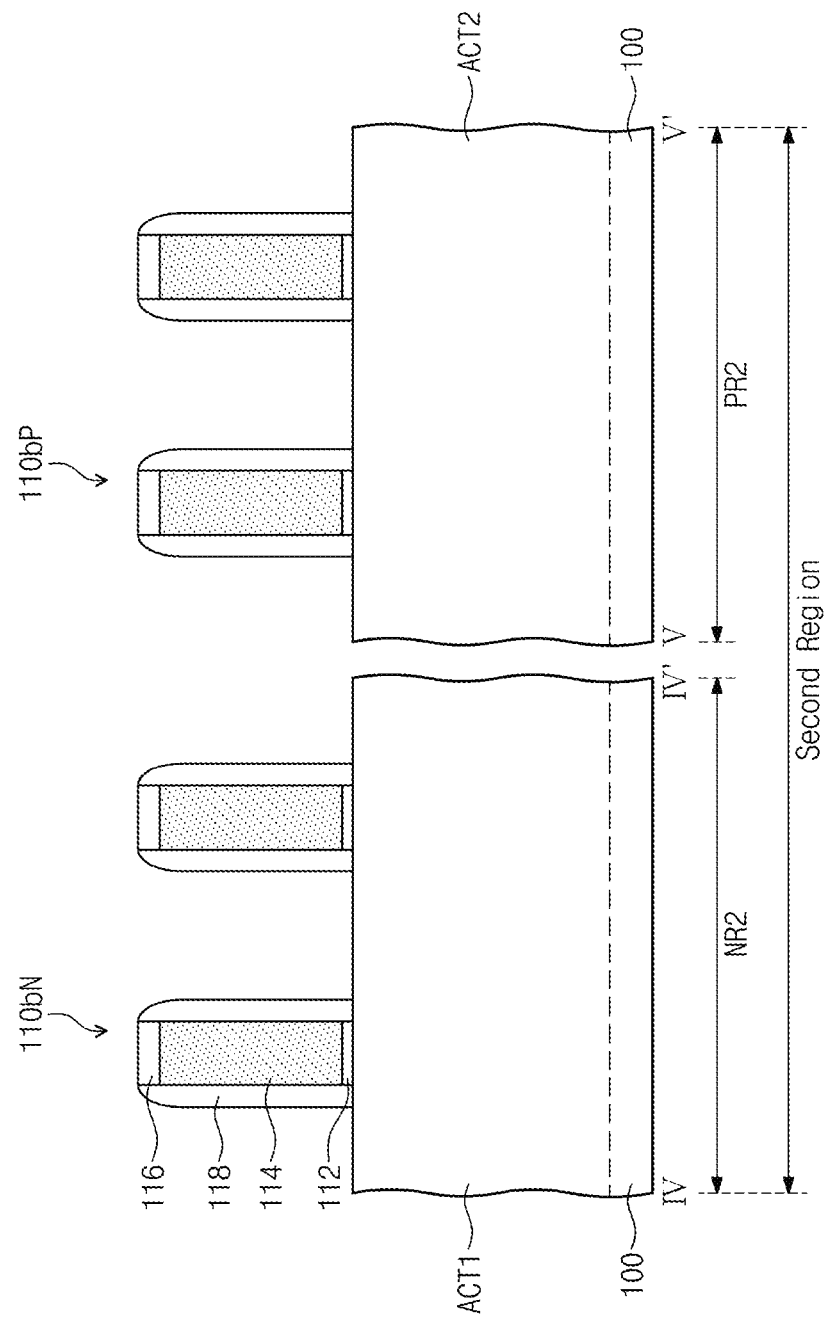

Referring to FIGS. 5A and 5B, first preliminary gate structures 110aN and 110aP may be formed to intersect the active patterns ACT1 and ACT2 and the device isolation patterns STI2 of the first region. Second preliminary gate structures 110bN and 110bP may be formed to intersect the active patterns ACT1 and ACT2 and the device isolation patterns STI2 of the second region. The first preliminary gate structures 110aN and 110aP may include a first preliminary N-type gate structure 110aN formed on the first NMOSFET region NR1 and a first preliminary P-type gate structure 110aP formed on the first PMOSFET region PR1. The second preliminary gate structures 110bN and 110bP may include a second preliminary N-type gate structure 110bN formed on the second NMOSFET region NR2 and a second preliminary P-type gate structure 110bP formed on the second PMOSFET region PR2.

In example embodiments, the first preliminary gate structures 110aN and 110aP and the second preliminary gate structures 110bN and 110bP may be formed at the same time. For example, an insulating thin layer and a sacrificial gate layer which cover the active patterns ACT1 and ACT2 and the device isolation patterns STI2 may be sequentially formed on the substrate 100. The insulating thin layer may include a silicon oxide layer. The sacrificial gate layer may include a material having an etch selectivity with respect to the insulating thin layer. For example, the sacrificial gate layer may include a poly-silicon layer.

Gate mask patterns 116 may be formed on the sacrificial gate layer. For example, the gate mask patterns 116 may include silicon nitride. The sacrificial gate layer and the insulating thin layer may be etched using the gate mask patterns 116 as etch masks to form sacrificial gate patterns 114 and insulating patterns 112. The sacrificial gate patterns 114 and the insulating patterns 112 may extend in a second direction DR2 intersecting the first direction DR1. The second direction DR2 may be perpendicular to the first direction DR1.

Gate spacers 118 may be formed on both sidewalls of the insulating pattern 112, the sacrificial gate pattern 114 and the gate mask pattern 116. A gate spacer layer may be conformally formed on the insulating pattern 112, the sacrificial gate pattern 114, and the gate mask pattern 116 which are vertically stacked, and an anisotropic etching process may be performed on the gate spacer layer to form the gate spacers 118. The gate spacer layer may include silicon nitride.

Thus, the first and second preliminary gate structures 110aN, 110aP, 110bN, and 110bP, each of which includes the insulating pattern 112, the sacrificial gate pattern 114, the gate mask pattern 116, and the gate spacers 118, may be formed on the substrate 100 having the active patterns ACT1 and ACT2. The first and second preliminary gate structures 110aN, 110aP, 110bN, and 110bP may extend in the second direction DR2 and may be spaced apart from each other in the first direction DR1.

Figure 6A:
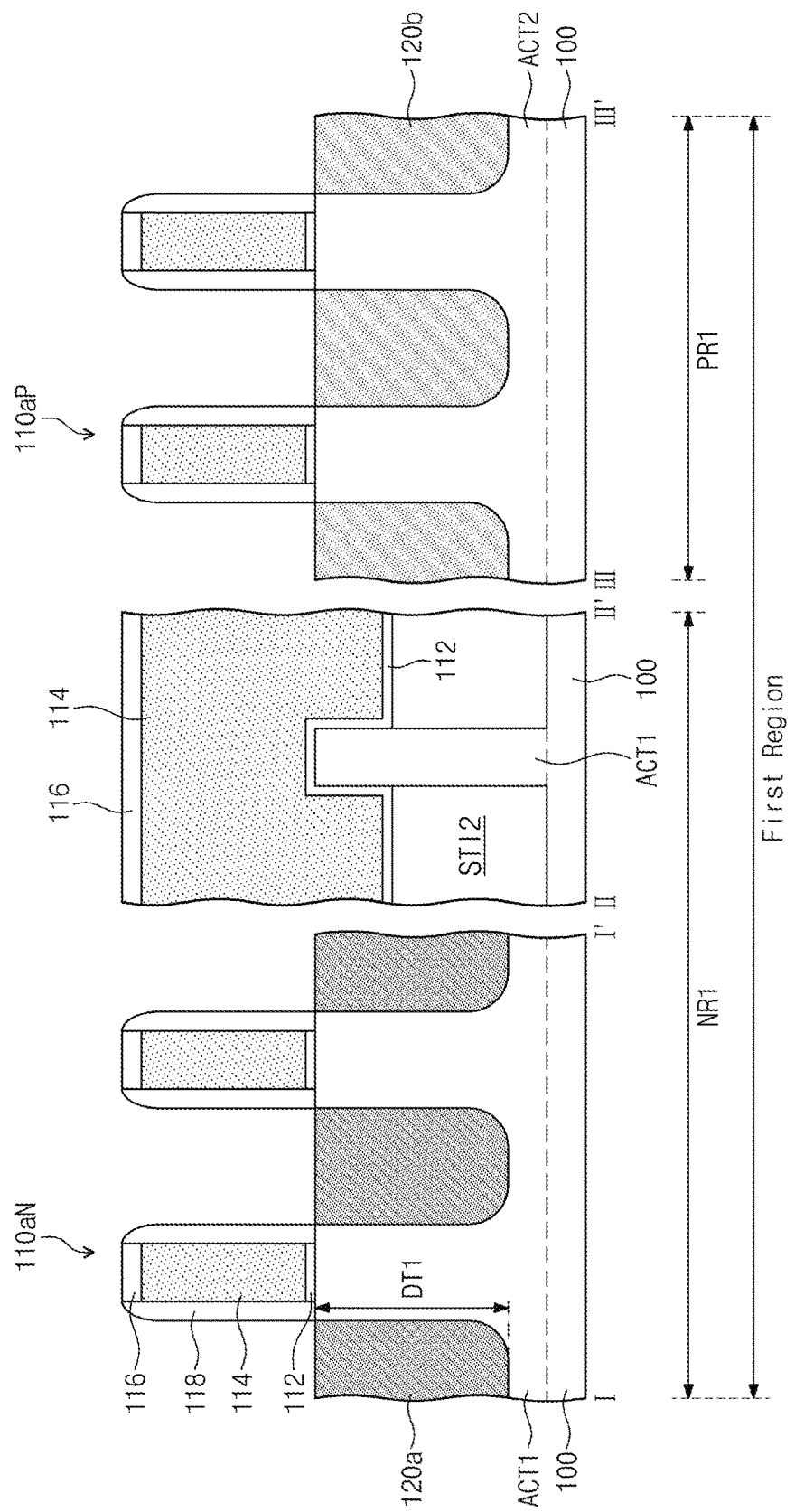
Figure 6B:
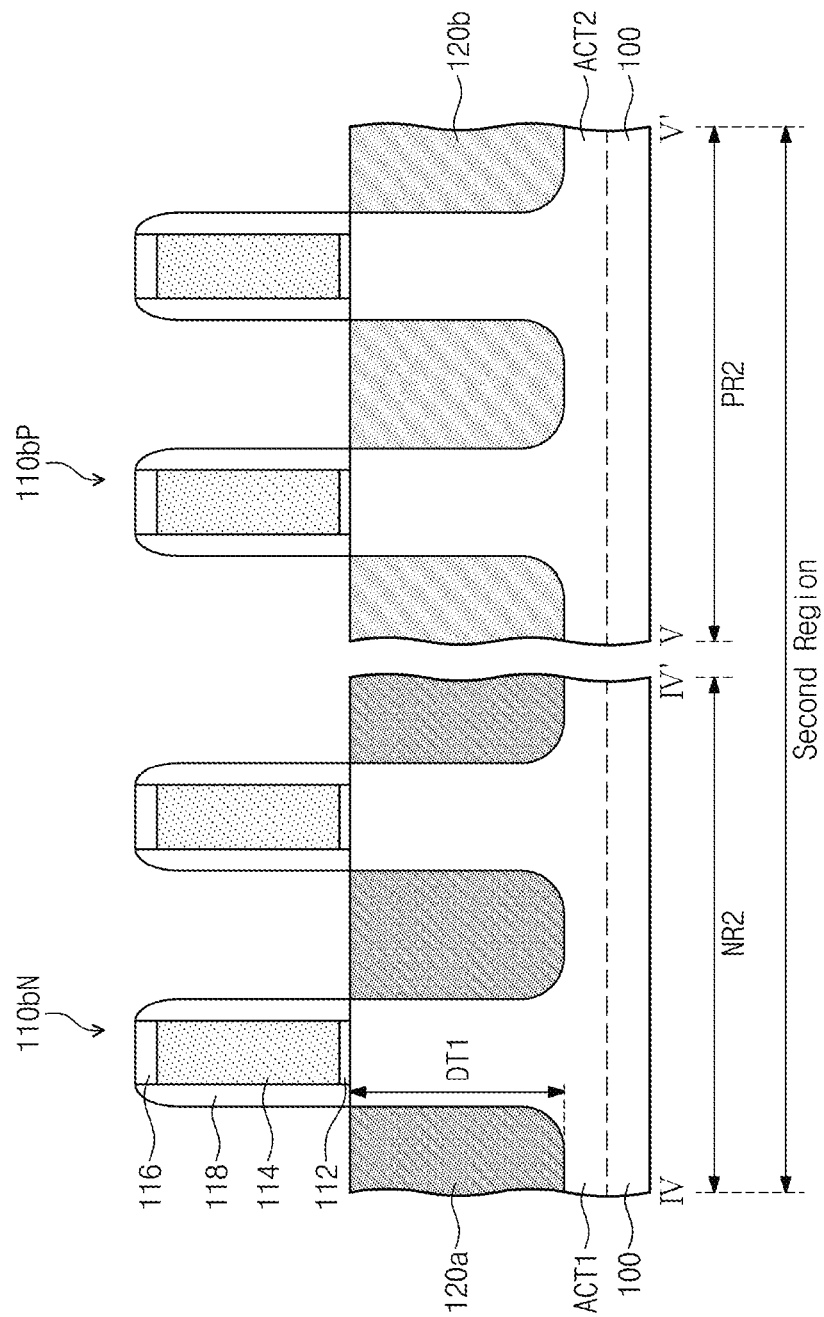

Referring to FIGS. 6A and 6B, an ion implantation process may be performed on the first active patterns ACT1 exposed by the first and second preliminary N-type gate structures 110aN and 110bN formed on the first and second NMOSFET regions NR1 and NR2 of the first and second regions, thereby forming first halo regions 120a. In example embodiments, the first halo regions 120a may be formed by implanting P-type dopant ions (e.g., $BF_2$ ions) with an energy of about 15 KeV to about 30 KeV. The ion implantation process may be performed at a tilt angle of about 10 degrees to about 25 degrees with respect to a surface of the substrate 100. Subsequently, a thermal treatment process may be performed to diffuse the implanted P-type dopant ions to a first depth DT1. The first depth DT1 may be a distance from a top surface of the first active pattern ACT1 to a bottom surface of the first halo region 120a. A dopant dose (e.g., a dose of the P-type dopant ions) used to form the first halo regions 120a may range from about $1.0\times10^{12}/cm^2$ to about $3.0\times10^{14}/cm^2$.

An ion implantation process may be performed on the second active patterns ACT2 exposed by the first and second preliminary P-type gate structures 110aP and 110bP formed on the first and second PMOSFET regions PR1 and PR2 of the first and second regions, thereby forming second halo regions 120b. In example embodiments, the second halo regions 120b may be formed by implanting N-type dopant ions (e.g., As ions) with an energy of about 25 KeV to about 50 KeV. The ion implantation process of forming the second halo regions 120b may be performed at a tilt angle of about 10 degrees to about 25 degrees with respect to the surface of the substrate 100. Subsequently, a thermal treatment process may be performed to diffuse the implanted N-type dopant ions to the first depth DT1. A dopant dose (e.g., a dose of the N-type dopant ions) used to form the second halo regions 120b may range from about $1.0\times10^{12}/cm^2$ to about $3.5\times10^{14}/cm^2$.

Figure 7A:
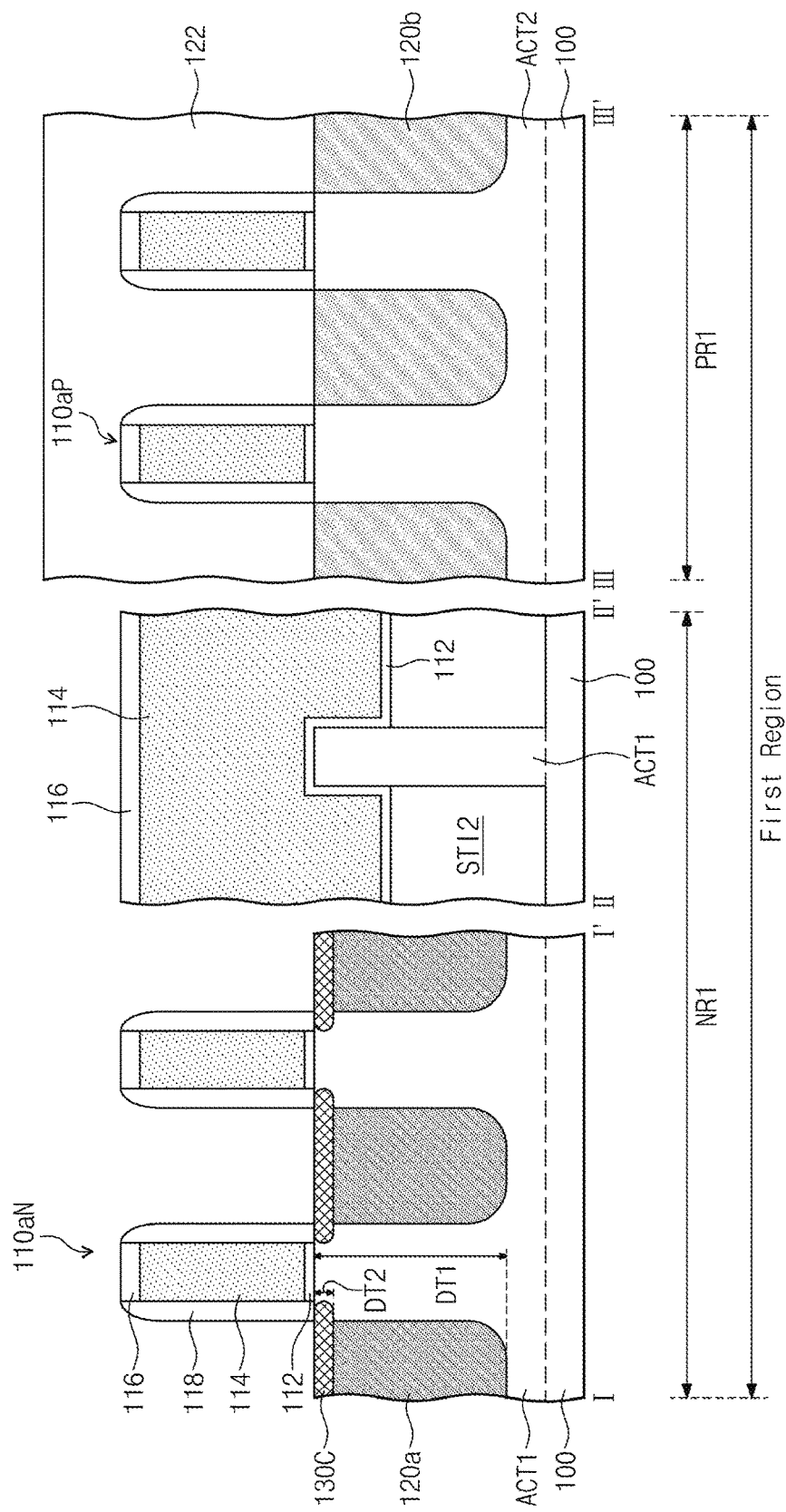
Figure 7B:
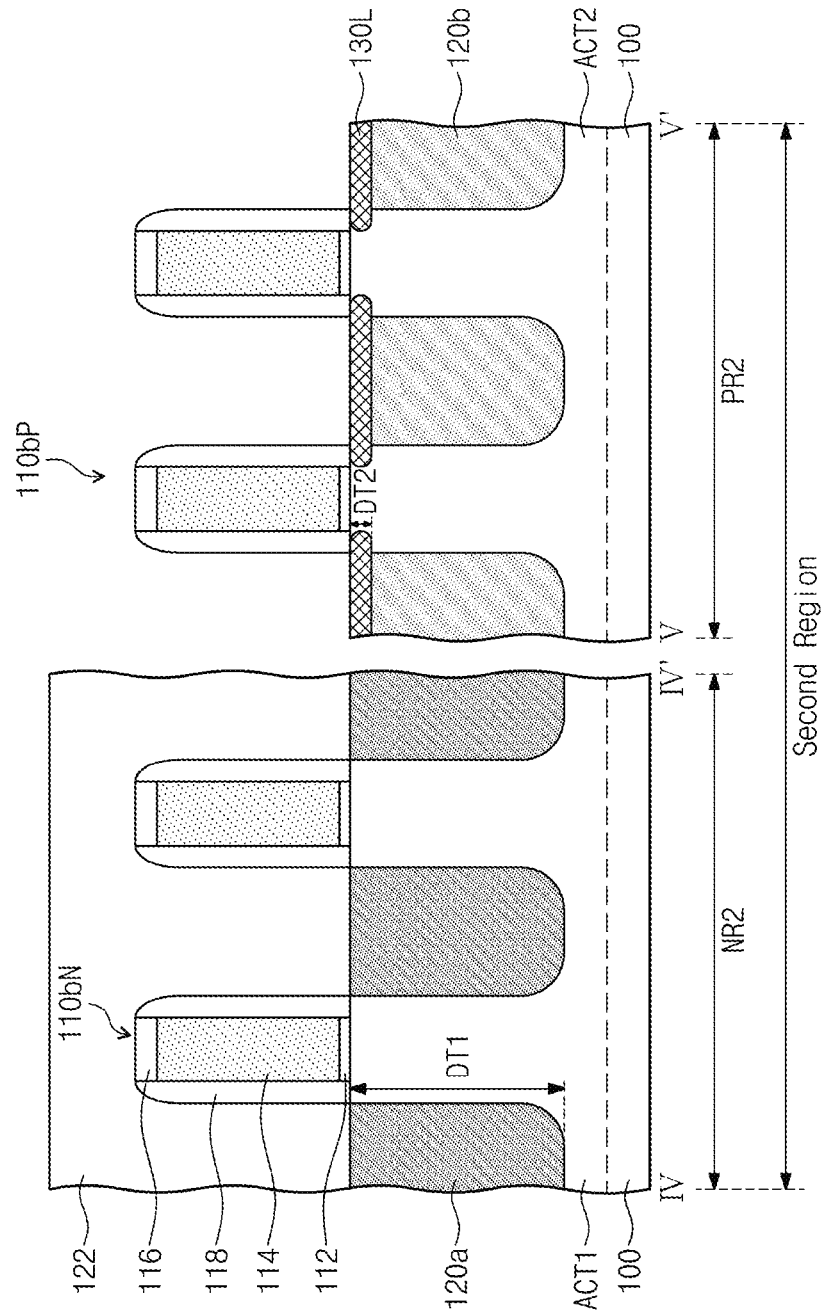

Referring to FIGS. 7A and 7B, first counter regions 130C may be formed in the first active pattern ACT1 of the first NMOSFET region NR1 of the first region by an ion implantation process. First LDD regions 130L may be formed in the second active pattern ACT2 of the second PMOSFET region PR2 of the second region by the same ion implantation process as the first counter regions 130C when the first counter regions 130C are formed.

In example embodiments, a first mask 122 may be formed to cover the first PMOSFET region PR1 of the first region of the substrate 100 and the second NMOSFET region NR2 of the second region of the substrate 100. The first mask 122 may include a photoresist. The ion implantation process may be performed using the first mask 122, the first preliminary N-type gate structure 110aN, and the second preliminary P-type gate structure 110bP as ion masks on the first active pattern ACT1 of the first region and the second active pattern ACT2 of the second region. The ion implantation process of forming the first counter region 130C and the first LDD region 130L may be performed using P-type dopant ions (e.g., $BF_2$ ions) with an energy of about 3 KeV to about 9 KeV. The ion implantation process may be performed in a direction substantially perpendicular to the surface of the substrate 100. Subsequently, a thermal treatment process may be performed to diffuse the implanted P-type dopant ions to a second depth DT2 smaller than the first depth DT1.

As a result, the first counter regions 130C may be formed in the first region, and the first LDD regions 130L may be formed in the second region. The first counter region 130C may have the same depth (e.g., the second depth DT2) as the first LDD region 130L. In addition, the first counter region 130C may be diffused to under the first preliminary N-type gate structure 110aN to overlap with a portion of the first preliminary N-type gate structure 110aN. The first LDD region 130L may be diffused to under the second preliminary P-type gate structure 110bP to overlap with a portion of the second preliminary P-type gate structure 110bP. Furthermore, a P-type dopant dose used to form the first counter region 130C and the first LDD region 130L may range from about $9.5\times10^{13}/cm^2$ to about $1.25\times10^{14}/cm^2$.

As described above, the first counter region 130C of the first region and the first LDD region 130L of the second region may be formed together by one ion implantation process. Thus, fabricating processes of the semiconductor device may be simplified.

Meanwhile, the process of forming the first halo regions 120a, the process of forming the second halo regions 120b, and the process of forming the first counter region 130C and the first LDD region 130L may be performed in-situ. Alternatively, the process of forming the first halo regions 120a, the process of forming the second halo regions 120b, and the process of forming the first counter region 130C and the first LDD region 130L may be performed in chambers different from each other.

The first mask 122 may be removed after the formation of the first counter region 130C and the first LDD region 130L.

Figure 8A:
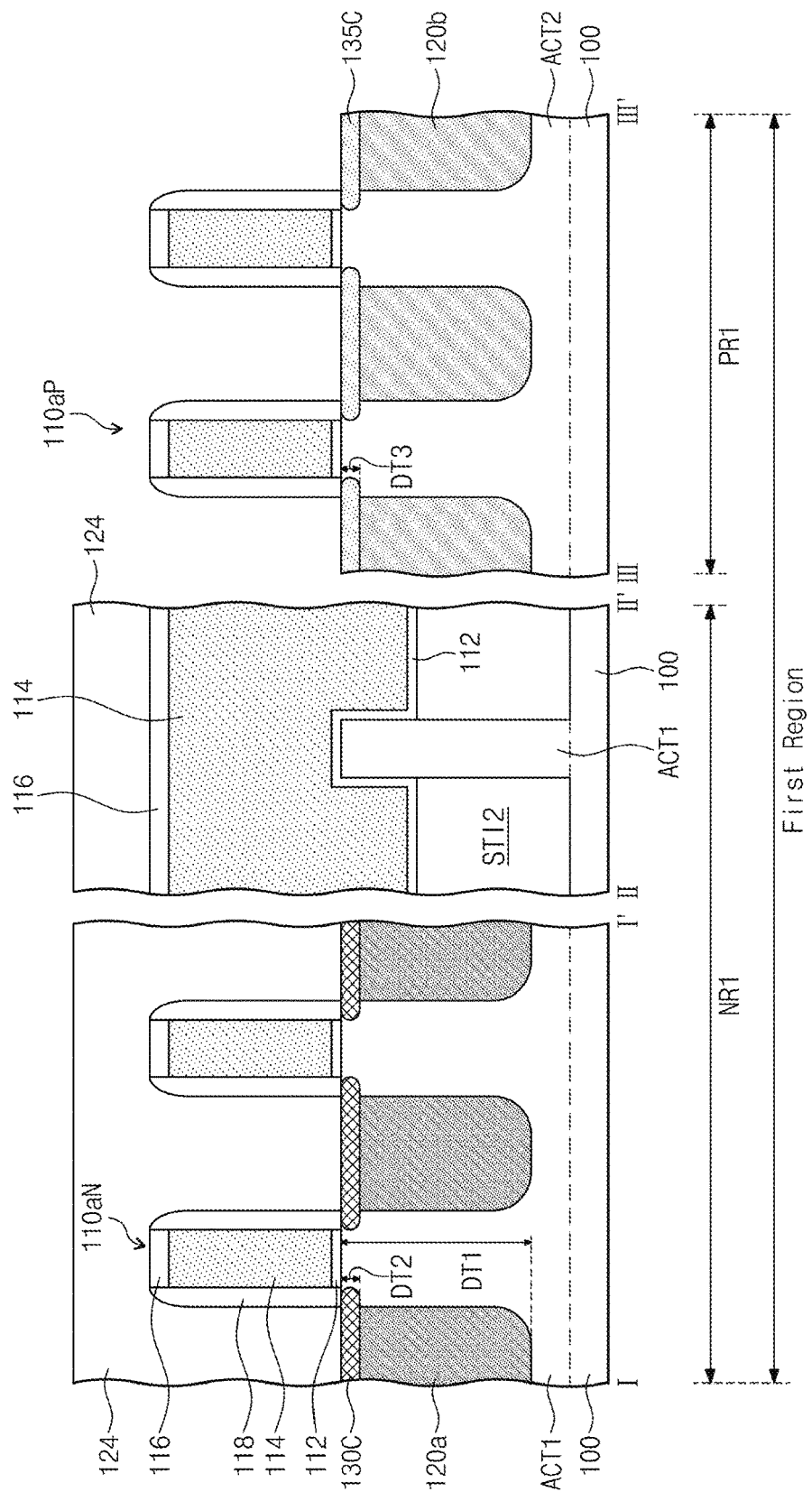
Figure 8B:
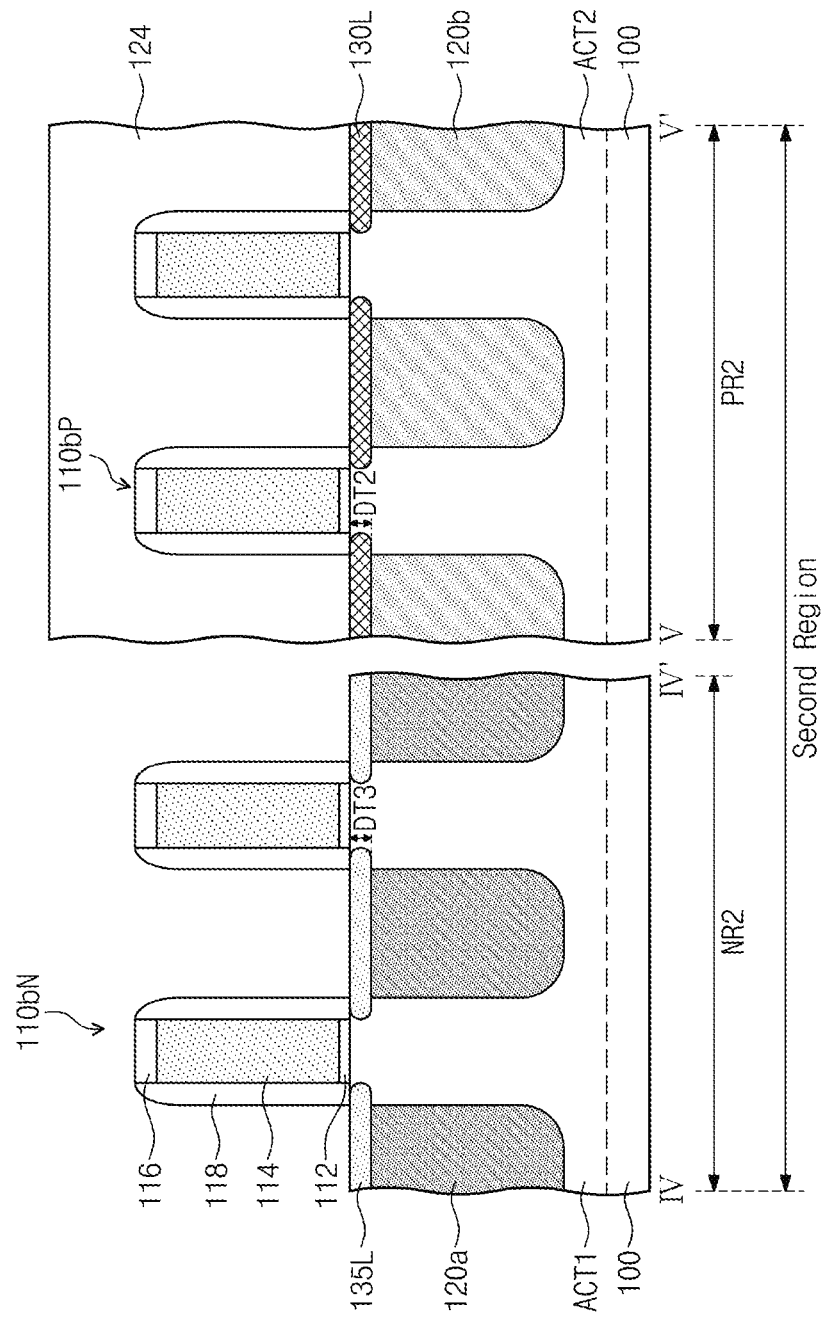

Referring to FIGS. 8A and 8B, second counter regions 135C may be formed in the second active pattern ACT2 of the first PMOSFET region PR1 of the first region by an ion implantation process. Second LDD regions 135L may be formed in the first active pattern ACT1 of the second NMOSFET region NR2 of the second region by the same ion implantation process as the second counter regions 135C when the second counter regions 135C are formed.

In example embodiments, a second mask 124 may be formed to cover the first NMOSFET region NR1 of the first region of the substrate 100 and the second PMOSFET region PR2 of the second region of the substrate 100. The second mask 124 may include a photoresist. The ion implantation process may be performed using the second mask 124, the first preliminary P-type gate structure 110aP, and the second preliminary N-type gate structure 110bN as ion masks on the second active pattern ACT2 of the first region and the first active pattern ACT1 of the second region. The ion implantation process of forming the second counter region 135C and the second LDD region 135L may be performed using N-type dopant ions (e.g., As ions) with an energy of about 3 KeV to about 9 KeV. The ion implantation process of forming the second counter region 135C and the second LDD region 135L may be performed in the direction substantially perpendicular to the surface of the substrate 100 or may be performed at a tilt angle of about 10 degrees to about 30 degrees. Subsequently, a thermal treatment process may be performed to diffuse the implanted N-type dopant ions to a third depth DT3.

As a result, the second counter regions 135C may be formed in the first region, and the second LDD regions 135L may be formed in the second region. The second counter region 135C and the second LDD region 135L may have the third depth DT3 smaller than the first depth DT1. For example, the third depth DT3 may be substantially equal to the second depth DT2. In addition, the second counter region 135C may be diffused to under the first preliminary P-type gate structure 110aP to overlap with a portion of the first preliminary P-type gate structure 110aP. The second LDD region 135L may be diffused to under the second preliminary N-type gate structure 110bN to overlap with a portion of the second preliminary N-type gate structure 110bN. Furthermore, an N-type dopant dose used to form the second counter region 135C and the second LDD region 135L may range from about $5.0 \times 10^{13}/cm^2$ to about $1.25 \times 10^{14}/cm^2$.

As described above, the second counter region 135C of the first region and the second LDD region 135L of the second region may be formed together by one ion implantation process. Thus, fabricating processes of the semiconductor device may be simplified.

Meanwhile, at least two of the process of forming the first halo regions 120a, the process of forming the second halo regions 120b, the process of forming the first counter region 130C and the first LDD region 130L, and the process of forming the second counter region 135C and the second LDD region 135L may be performed in-situ. Alternatively, the process of forming the first halo regions 120a, the process of forming the second halo regions 120b, the process of forming the first counter region 130C and the first LDD region 130L, and the process of forming the second counter region 135C and the second LDD region 135L may be performed in chambers different from each other.

The second mask 124 may be removed after the formation of the second counter region 135C and the second LDD region 135L.

Figure 9A:
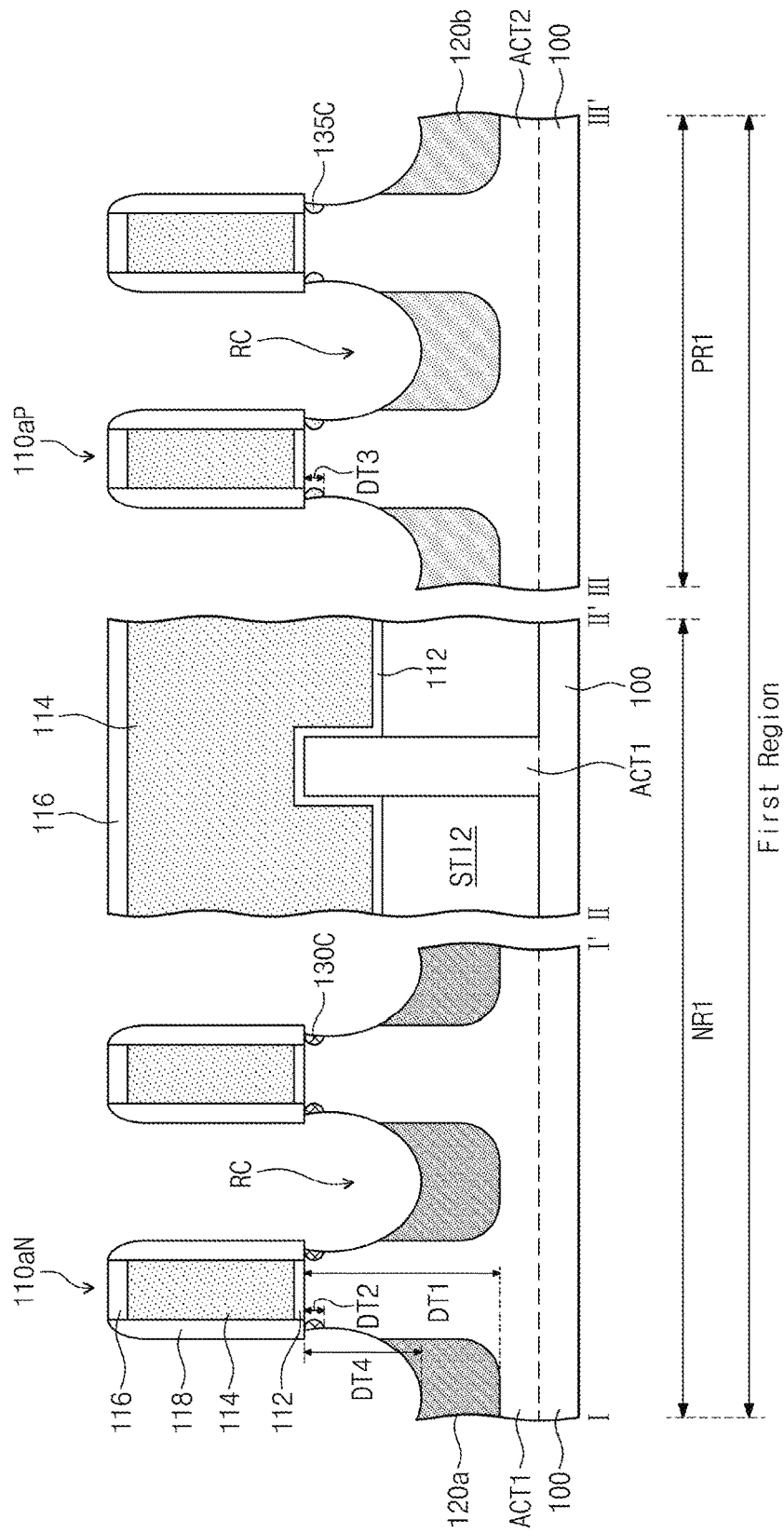
Figure 9B:
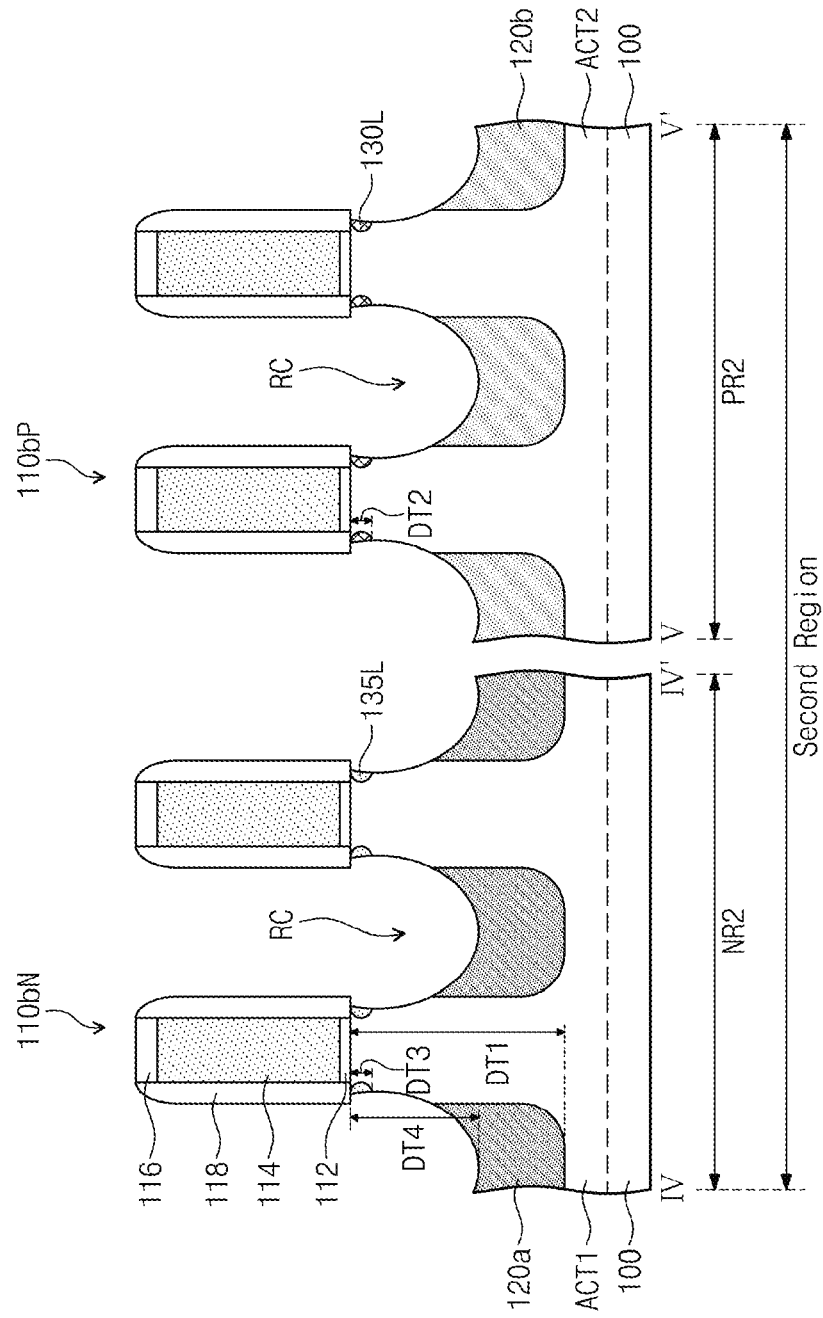

Referring to FIGS. 9A and 9B, the first and second active patterns ACT1 and ACT2 exposed by the first and second preliminary gate structures 110aN, 110aP, 110bN, and 110bP may be etched to form recess regions RC. Each of the recess regions RC may have a fourth depth DT4 that is smaller than the first depth DT1 and greater than the second or third depth DT2 and DT3.

In example embodiments, the first active patterns ACT1 and the second active patterns ACT2 may be etched using the first preliminary gate structures 110aN and 110aP and the second preliminary gate structures 110bN and 110bP as etch masks. The etching process may include an anisotropic etching process in a depth direction and an isotropic etching process in depth and width directions.

The recess regions RC of the first region may be formed by etching the first and second counter regions 130C and 135C and the first and second halo regions 120a and 120b disposed under the first and second counter regions 130C and 135C. Portions of the first and second counter regions 130C and 135C, which overlap with the first preliminary gate structures 110aN and 110aP, may not be etched but remain during the etching process. In addition, the etching process may be performed such that upper portions of the first and second halo regions 120a and 120b are etched but lower portions of the first and second halo regions 120a and 120b remain. The first counter region 130C may be spaced apart from the first halo region 120a by the recess region RC adjacent to the first counter region 130C, and the second counter region 135C may be spaced apart from the second halo region 120b by the recess region RC adjacent to the second counter region 135C. In other words, the first counter region 130C may not be in contact with the first halo region 120a, and the second counter region 135C may not be in contact with the second halo region 120b.

The recess regions RC of the second region may be formed by etching the first and second LDD regions 130L and 135L and the second and first halo regions 120b and 120a disposed under the first and second LDD regions 130L and 135L. Portions of the first and second LDD regions 130L and 135L, which overlap with the second preliminary gate structures 110bN and 110bP, may not be etched but remain during the etching process. In addition, the etching process may be performed such that upper portions of the first and second halo regions 120a and 120b are etched but lower portions of the first and second halo regions 120a and 120b remain. The second LDD region 135L may be spaced apart from the first halo region 120a by the recess region RC adjacent to the second LDD region 135L, and the first LDD region 130L may be spaced apart from the second halo region 120b by the recess region RC adjacent to the first LDD region 130L. In other words, the second LDD region 135L may not be in contact with the first halo region 120a, and the first LDD region 130L may not be in contact with the second halo region 120b.

Figure 10A:
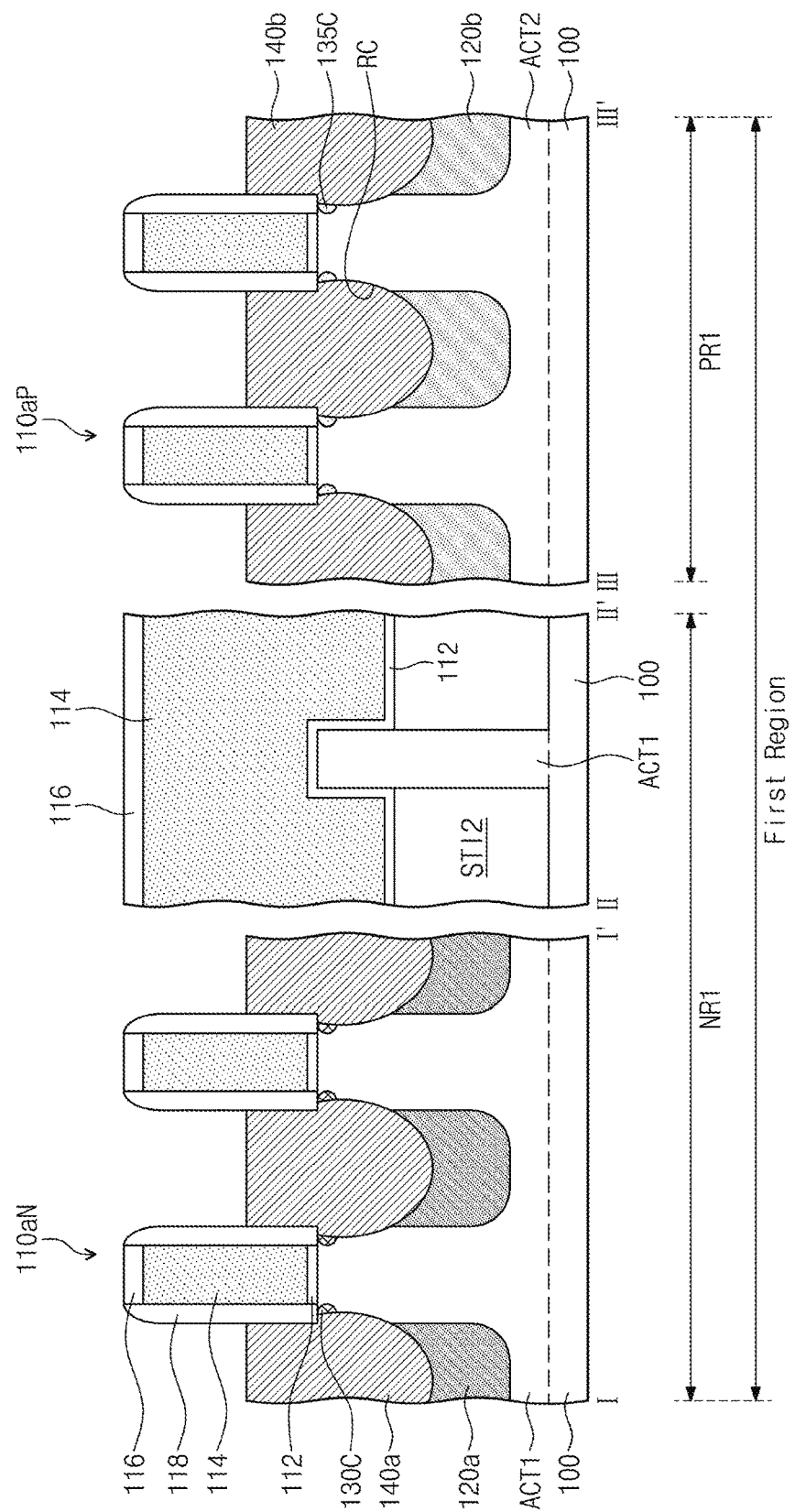
Figure 10B:
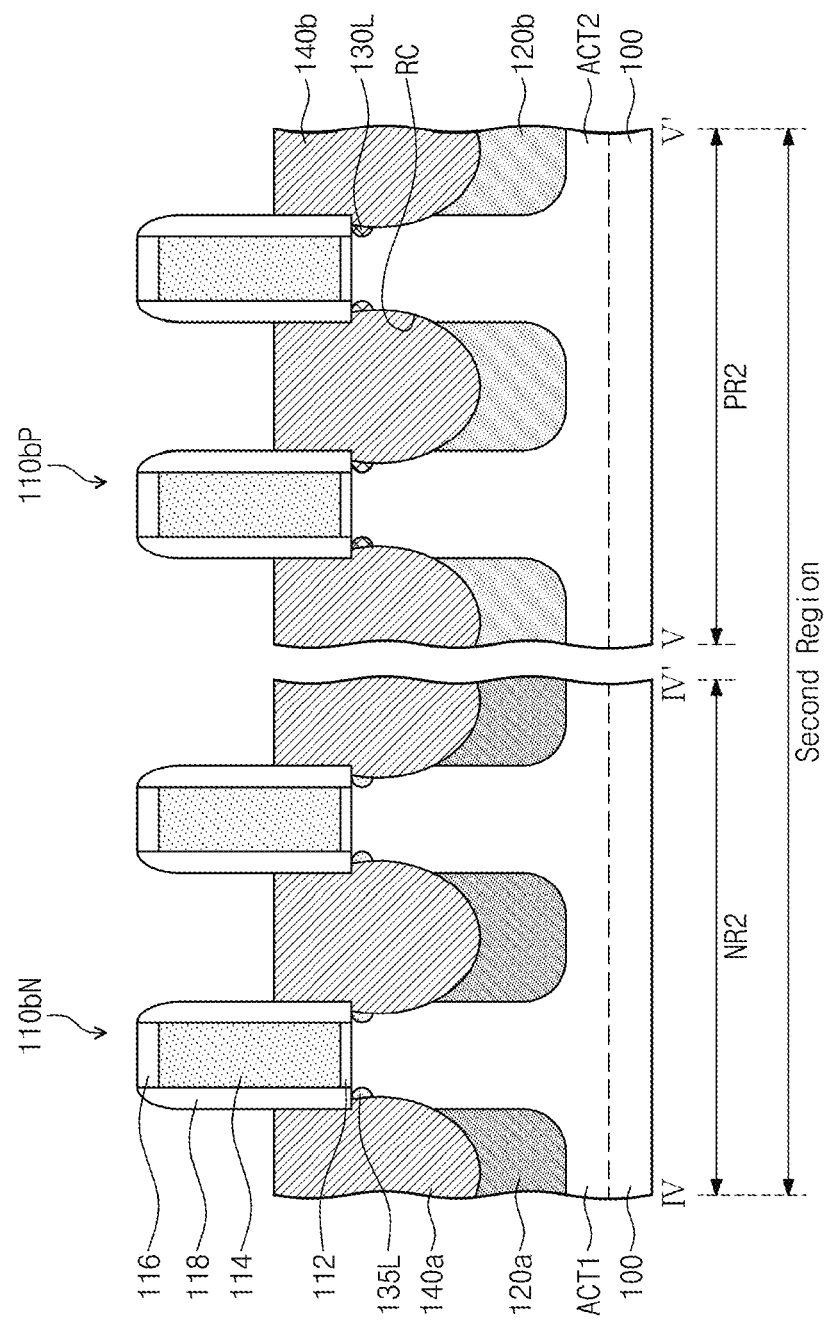

Referring to FIGS. 10A and 10B, first source/drain regions 140a and second source/drain regions 140b may be formed to fill the recess regions RC, respectively. The first source/drain regions 140a may include N-type dopants, and the second source/drain regions 140b may include P-type dopants.

Each of the first and second regions may include the first source/drain regions 140a and the second source/drain regions 140b. For example, the first source/drain regions 140a may be formed on the first NMOSFET region NR1 of the first region, and the second source/drain regions 140b may be formed on the first PMOSFET region PR1 of the first region. The first source/drain regions 140a may also be formed on the second NMOSFET region NR2 of the second region, and the second source/drain regions 140b may also be formed on the second PMOSFET region PR2 of the second region.

The first source/drain regions 140a may be formed by performing a selective epitaxial growth (SEG) process on the substrate 100 exposed by the recess regions RC. In example embodiments, N-type dopants may be provided during the SEG process. In some examples, N-type dopants may be provided into the first source/drain regions 140a after the SEG process. The ion implantation process for forming the first source/drain regions 140a may be performed using N-type dopant ions (e.g., As ions) with an energy of about 5 KeV to about 15 KeV. The ion implantation process may be performed in the direction substantially perpendicular to the surface of the substrate 100. For example, a dopant dose used to form the first source/drain regions 140a may range from about $5.0 \times 10^{13}/cm^2$ to about $1.0 \times 10^{15}/cm^2$.

The second source/drain regions 140b may be formed by performing a SEG process on the substrate 100 exposed by the recess regions RC. In example embodiments, P-type dopants may be provided during the SEG process of the second source/drain regions 140b. In some examples, P-type dopants may be provided into the second source/drain regions 140b after the SEG process. The ion implantation process for forming the second source/drain regions 140b may be performed using P-type dopant ions (e.g., $BF_2$ ions) with an energy of about 15 KeV to about 30 KeV. The ion implantation process of the second source/drain regions 140b may be performed in the direction substantially perpendicular to the surface of the substrate 100. For example, a dopant dose used to form the second source/drain regions 140b may range from about $1.0 \times 10^{14}/cm^2$ to about $1.0 \times 10^{16}/cm^2$.

Since the first and second source/drain regions 140a and 140b are formed using the SEG processes as described above, each of the first and second source/drain regions 140a and 140b may include a lower portion filling each of the recess regions RC and an upper portion protruding from top surfaces of the first and second active patterns ACT1 and ACT2. In example embodiments, the upper portion of each of the first and second source/drain regions 140a and 140b may have a polygonal cross section.

Figure 11A:
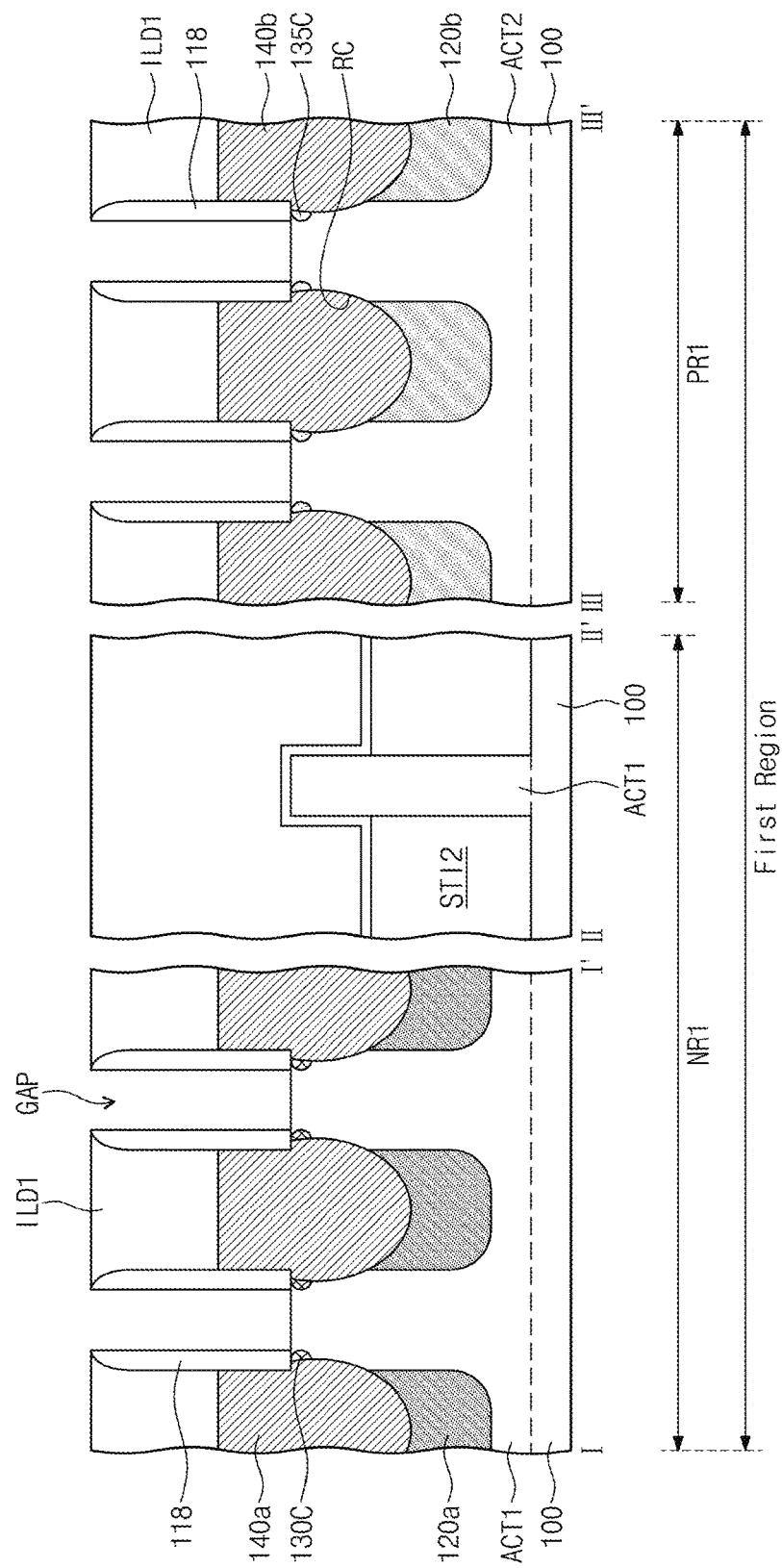
Figure 11B:
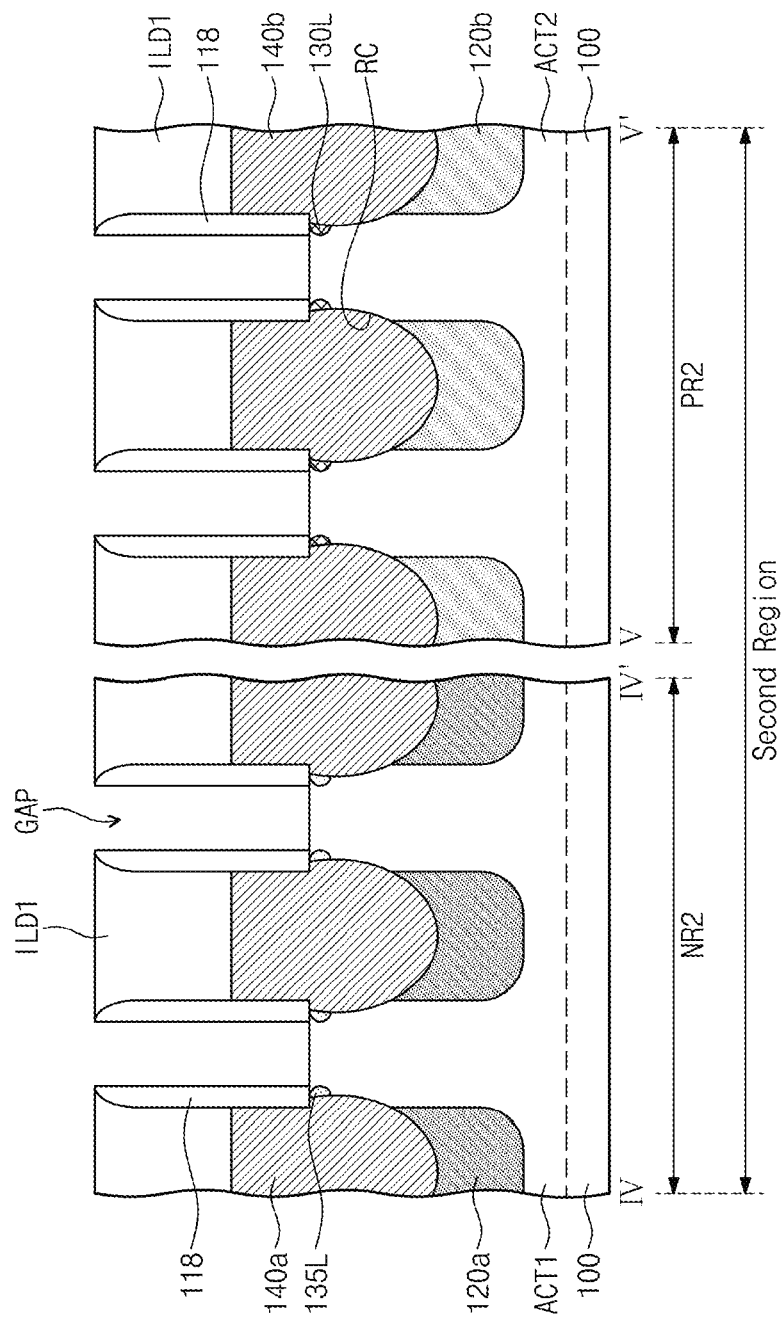

Referring to FIGS. 11A and 11B, a first interlayer insulating layer ILD1 may be formed on the substrate 100 having the first preliminary gate structures 110aN and 110aP, the second preliminary gate structures 110bN and 110bP, and the first and second source/drain regions 140a and 140b.

Forming the first interlayer insulating layer ILD1 may include forming an insulating layer covering the first preliminary gate structures 110aN and 110aP, the second preliminary gate structures 110bN and 110bP, and the first and second source/drain regions 140a and 140b, and planarizing the insulating layer until top surfaces of the first and second preliminary gate structures 110aN, 110aP, 110bN, and 110bP are exposed. For example, the first interlayer insulating layer ILD1 may include at least one of a silicon oxide layer, a silicon nitride layer, or a silicon oxynitride layer.

The gate mask patterns 116, the sacrificial gate patterns 114, and the insulating patterns 112 of the first and second preliminary gate structures 110aN, 110aP, 110bN, and 110bP may be removed to form gap regions GAP, each of which is disposed between the gate spacers 118. The gap regions GAP may expose the top surfaces and sidewalls of the first and second active patterns ACT1 and ACT2.

Figure 12A:
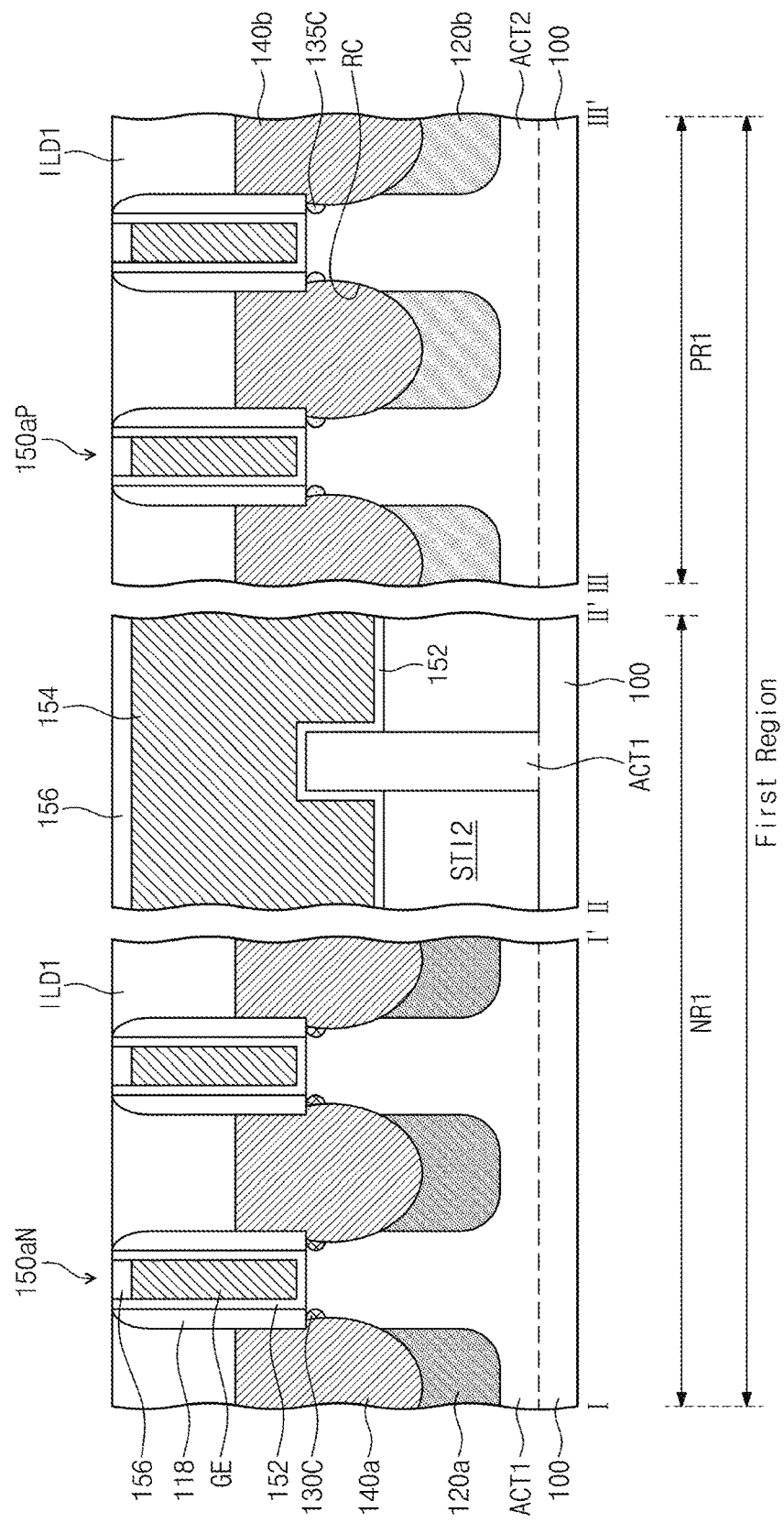
Figure 12B:
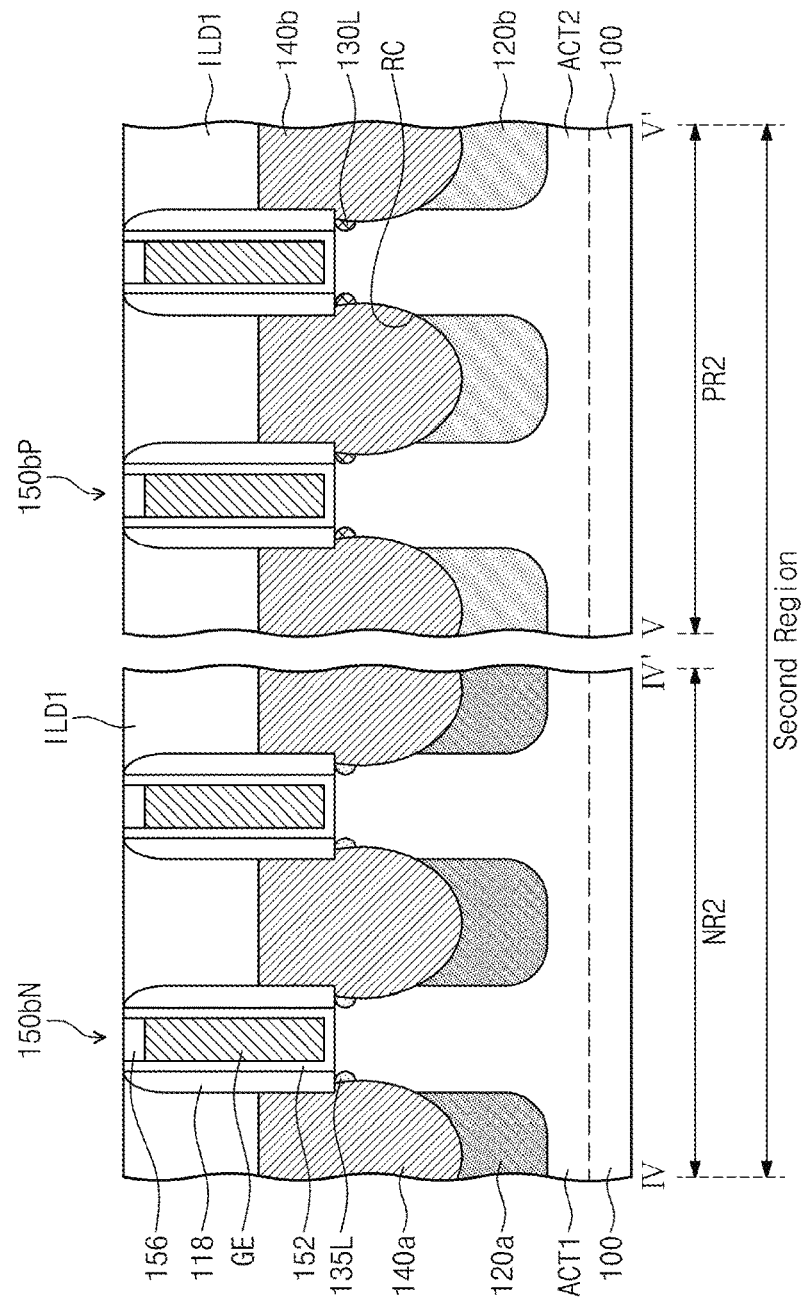

Referring to FIGS. 12A and 12B, a gate insulating layer 152 and a gate electrode GE may be formed in each of the gap regions GAP.

In example embodiments, the gate insulating layer 152 may be conformally formed on the top surfaces and sidewalls of the first and second active patterns ACT1 and ACT2 and the gate spacers 118, which are exposed through the gap regions GAP. The gate insulating layer 152 may include at least one of, but not limited to, hafnium oxide, hafnium silicate, zirconium oxide, or zirconium silicate. The gate insulating layer 152 may be formed by performing, for example, an atomic layer deposition (ALD) process.

A gate layer may be formed on the gate insulating layer 152 to fill the gap regions GAP. The gate layer may include at least one of a conductive metal nitride (e.g., titanium nitride or tantalum nitride) or a metal (e.g., aluminum, tungsten, or copper).

The gate layer and the gate insulating layer 152 may be planarized until top ends of the gate spacers 118 are exposed. Thus, the gate insulating layer 152 may be confined in each of the gap regions GAP, and the gate electrode GE may be formed in each of the gap regions GAP. The gate insulating layer 152 may be disposed between the gate electrode GE and a pair of the gate spacers 118 and may have a U-shape.

Top surfaces of the gate electrodes GE may be recessed. In this case, the gate insulating layer 152 may also be etched.

An empty region may be defined on the recessed gate electrode GE in each of the gap regions GAP. A capping pattern 156 may be formed in the empty region of each of the gap regions GAP. For example, the capping pattern 156 may include silicon nitride.

The gate electrode GE, the gate insulating layer 152, the capping pattern 156, and the pair of gate spacers 118 may constitute a gate structure.

The gate structures may include first gate structures 150aN and 150aP provided on the first region and second gate structures 150bN and 150bP provided on the second region.

As described above, the first gate structures constituting the memory cells of the first region and the second gate structures constituting the logic circuit of the second region may be formed at the same time. If thicknesses of gate electrodes are adjusted to adjust currents and voltages (e.g., threshold voltages) measured from logic transistors, currents and voltages measured from memory cell transistors may be beyond desired ranges. According to example embodiments of inventive concepts, to adjust currents and voltages of the logic transistors and to stabilize currents and voltage of the memory cell transistors, the counter regions 130C and 135C may be formed along with the halo regions 120a and 120b in the memory cell transistors, and the LDD regions 130L and 135L may be formed along with the halo regions 120a and 120b in the logic transistors.

Referring again to FIGS. 2 and 3, a second interlayer insulating layer ILD2 may be formed on the first interlayer insulating layer ILD1. For example, the second interlayer insulating layer ILD2 may include at least one of a silicon oxide layer, a silicon nitride layer, or a silicon oxynitride layer.

Contact holes may be formed to penetrate the second and first interlayer insulating layers ILD2 and ILD1. The contact holes may expose the first and second source/drain regions 140a and 140b, respectively. The exposed portions of the first and second source/drain regions 140a and 140b may be recessed during an etching process of forming the contact holes. Next, source/drain contact plugs CA may be formed to fill the contact holes, respectively. The source/drain contact plugs CA may include at least one of tungsten, titanium, or tantalum.

In example embodiments, a silicide process may be performed to form a metal silicide layer SIC between each of the source/drain contact plugs CA and a corresponding one of the first and second source/drain regions 140a and 140b. For example, the metal silicide layer SIC may include at least one of titanium silicide, tantalum silicide, or tungsten silicide.

According to example embodiments of inventive concepts, the counter regions may be provided along with the halo regions, and thus variation of the threshold voltages may be reduced. In addition, the counter regions may be formed in the cell transistors of the memory cells, and the LDD regions may be formed in the logic transistors of the logic circuit. Thus, the currents and the voltages of the logic transistors may be adjusted and the currents and the voltages of the cell transistors may be stabilized.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating a semiconductor device, the method comprising:
    forming a device isolation pattern on a substrate including an active pattern protruding from the substrate, the device isolation pattern exposing an upper portion of the active pattern;
    forming a preliminary gate structure on the substrate, the preliminary gate structure intersecting the active pattern and the device isolation pattern;
    forming halo regions having a first depth in the active pattern, the forming the halo regions including implanting first dopant ions of a first conductivity type into the active pattern at both sides of the preliminary gate structure;
    forming counter regions having a second depth smaller than the first depth in the active pattern, the forming the counter regions including implanting second dopant ions of the first conductivity type into the active pattern at both sides of the preliminary gate structure;
    etching the active pattern at both sides of the preliminary gate structure to form recess regions, the counter regions being spaced apart from the halo regions by the recess regions; and
    forming source/drain regions in the recess regions using an epitaxial growth process, the source/drain regions including dopants of a second conductivity type opposite to the first conductivity type.

2. The method of claim 1, wherein each of the recess regions has a third depth that is smaller than the first depth and greater than the second depth.

3. The method of claim 1, wherein
    the first conductivity type is P-type,
    the forming the counter regions includes implanting the second dopant ions with an energy of about 3 keV to about 9 KeV into the active pattern after the forming the halo regions.

4. The method of claim 1, wherein
    the first conductivity type is N-type,
    the forming the counter regions includes implanting the second dopant ions with an energy of about 3 keV to about 9 KeV into the active pattern after the forming the halo regions.

5. The method of claim 1, wherein
    the forming the counter regions includes implanting the second dopant ions with an energy of about 3 keV to about 9 KeV into the active pattern after the forming the halo regions.

6. The method of claim 1, the forming the source/drain regions includes forming the source/drain regions so the first halo regions are spaced apart from the counter regions by the source/drain regions.

7. A method of fabricating a semiconductor device, the method comprising:
    forming a device isolation pattern on a substrate, the device isolation pattern defining a first active pattern of a first region of the substrate and a second active pattern of a second region of the substrate;
    forming a first preliminary gate structure on the first region, the first preliminary gate structure intersecting the first active pattern and the device isolation pattern;
    forming a second preliminary gate structure on the second region, the second preliminary gate structure intersecting the second active pattern and the device isolation pattern;
    forming halo regions in the first active pattern and the second active pattern, the forming the halo regions including implanting dopant ions of a first conductivity type into the first active pattern at both sides of the first preliminary gate structure and the second active pattern at both sides of the second preliminary gate structure;
    forming counter regions by implanting dopant ions of the first conductivity type into the first active pattern at both sides of the first preliminary gate structure;
    forming LDD regions by implanting dopant ions of a second conductivity type opposite to the first conductivity type into the second active pattern at both sides of the second preliminary gate structure;
    etching the first active pattern at both sides of the first preliminary gate structure and the second active pattern at both sides of the second preliminary gate structure to form first recess regions in the first active pattern and second recess regions in the second active pattern, the counter regions being spaced apart from the halo regions by the first recess regions, the LDD regions being spaced apart from the halo regions by the second recess regions; and
    forming first source/drain regions in the first recess regions and second source/drain regions in the second recess regions, the first and second source/drain regions including dopants of the second conductivity type.

8. The method of claim 7, wherein
    the first conductivity type is P-type,
    the second conductivity type is N-type,
    the forming the counter regions includes implanting P-type dopant ions with an energy of about 3 KeV to about 9 KeV into the first active pattern using a dopant dose that ranges from about $9.5 \times 10^{13}/cm^2$ to about $1.25 \times 10^{14}/cm^2$,
    the forming the LDD regions includes implanting N-type dopant ions with an energy of about 3 KeV to about 9 KeV into the second active pattern using a dopant dose that ranges from about $5.0 \times 10^{13}/cm^2$ to about $1.25 \times 10^{14}/cm^2$.

9. The method of claim 7, wherein
    the first conductivity type is N-type,
    the second conductivity type is P-type,
    the forming the counter regions includes implanting N-type dopant ions with an energy of about 3 KeV to about 9 KeV into the first active pattern using a dopant dose that ranges from about $5.0 \times 10^{13}/cm^2$ to about $1.25 \times 10^{14}/cm^2$,
    the forming the LDD regions includes implanting P-type dopant ions with an energy of about 3 KeV to about 9 KeV into the second active pattern using a dopant dose that ranges from about $9.5 \times 10^{13}/cm^2$ to about $1.25 \times 10^{14}/cm^2$.

10. The method of claim 7, further comprising:
    implanting dopant ions of the first conductivity type into the first active pattern at both sides of the first preliminary gate structure and the second active pattern at both sides of the second preliminary gate structure to form first halo regions and second halo regions after the forming the first and second preliminary gate structures.

11. The method of claim 7, wherein
    the forming the counter regions includes implanting N-type dopant or P-type dopant ions with an energy of about 3 keV to about 9 KeV into the first active pattern after forming halo regions having a first depth in the first active pattern.

12. The method of claim 7, further comprising:
forming first halo regions having a first depth in the first active pattern, wherein
the forming the first source/drain regions includes forming the first source/drain regions so the first halo regions are spaced apart from the counter regions by the first source/drain regions.

13. A method of fabricating a semiconductor device, the method comprising:
forming a device isolation pattern on a substrate, the device isolation pattern defining a first active pattern of a first region of the substrate and a second active pattern of a second region of the substrate;
forming a first preliminary N-type gate structure and a first preliminary P-type gate structure intersecting the first active pattern and the device isolation pattern on the first region;
forming a second preliminary N-type gate structure and a second preliminary P-type gate structure intersecting the second active pattern and the device isolation pattern on the second region;
injecting P-type dopants into the first active pattern and the second active pattern to form first counter regions in the first active pattern at both sides of the first preliminary N-type gate structure and to form first LDD regions in the second active pattern at both sides of the second preliminary P-type gate structure; and
etching the first active pattern at both sides of the first preliminary N-type gate structure, the first active pattern at both sides of the first preliminary P-type gate structure, the second active pattern at both sides of the second preliminary N-type gate structure, and the second active pattern at both sides of the second preliminary P-type gate structure to form first recess regions in the first region and second recess regions in the second region.

14. The method of claim 13, wherein the injecting P-type dopants includes an ion implantation process using an energy of about 3 KeV to about 9 KeV.

15. The method of claim 13, wherein the injecting P-type dopants uses a dopant dose that ranges from about $9.5 \times 10^{13}$/cm$^2$ to about $1.25 \times 10^{14}$/cm$^2$.

16. The method of claim 13, further comprising:
injecting N-type dopants into the first active pattern and the second active pattern to form second counter regions in the first active pattern at both sides of the first preliminary P-type gate structure and to form second LDD regions in the second active pattern at both sides of the second preliminary N-type gate structure before the etching the first active pattern at both sides of the first preliminary N-type gate structure, the first active pattern at both sides of the first preliminary P-type gate structure, the second active pattern at both sides of the second preliminary N-type gate structure, and the second active pattern at both sides of the second preliminary P-type gate structure to form first recess regions in the first region and second recess regions in the second region.

17. The method of claim 16, wherein the injecting N-type dopants includes an ion implantation process using an energy of about 3 KeV to about 9 KeV.

18. The method of claim 16, wherein the injecting N-type dopants uses a dopant dose that ranges from about $5.0 \times 10^{13}$/cm$^2$ to about $1.25 \times 10^{14}$/cm$^2$.

19. The method of claim 13, further comprising:
injecting P-type dopants into the first active pattern at both sides of the first preliminary N-type gate structure and the second active pattern at both sides of the second preliminary N-type gate structure to form first halo regions before the formation of the first counter regions and the first LDD regions; and
injecting N-type dopants into the first active pattern at both sides of the first preliminary P-type gate structure and the second active pattern at both sides of the second preliminary P-type gate structure to form second halo regions.

20. The method of claim 13, further comprising:
forming first source/drain regions in the first recess regions at both sides of the first preliminary N-type gate structure and the second recess regions at both sides of the second preliminary N-type gate structure using an epitaxial growth process, the first source/drain regions including N-type dopants; and
forming second source/drain regions in the first recess regions at both sides of the first preliminary P-type gate structure and the second recess regions at both sides of the second preliminary P-type gate structure using an epitaxial growth process, the second source/drain regions including P-type dopants.

* * * * *